(12) United States Patent
Nishibata et al.

(10) Patent No.: US 10,374,509 B2
(45) Date of Patent: Aug. 6, 2019

(54) CONTROL CIRCUIT FOR POWER CONVERTER

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Koichi Nishibata, Kariya (JP); Yusuke Shindo, Kariya (JP); Tomohisa Ose, Kariya (JP); Junichi Fukuta, Kariya (JP); Yasuhiro Terao, Okazaki (JP); Eiichiro Shigehara, Nagoya (JP); Keisuke Hata, Toyota (JP)

(73) Assignees: DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/194,903

(22) Filed: Nov. 19, 2018

(65) Prior Publication Data

US 2019/0157969 A1 May 23, 2019

(30) Foreign Application Priority Data

Nov. 21, 2017 (JP) .................................. 2017-224083

(51) Int. Cl.
*H02M 1/32* (2007.01)
*H02H 7/122* (2006.01)
*H02P 27/06* (2006.01)
*H02P 29/024* (2016.01)
(Continued)

(52) U.S. Cl.
CPC ............ *H02M 1/32* (2013.01); *H02H 1/0007* (2013.01); *H02H 7/1222* (2013.01); *H02M 7/53871* (2013.01); *H02P 27/06* (2013.01); *H02P 29/0241* (2016.02)

(58) Field of Classification Search
CPC .... H02H 1/007; H02M 7/53871; H02M 1/32; B60L 3/003; H02P 29/0241
USPC ...... 363/49, 55, 56.02, 56.03, 56.05, 65, 97, 363/98, 132; 318/479, 490, 563, 799, 318/800; 361/91, 93.2, 94, 97
See application file for complete search history.

(56) References Cited

U.S. PATENT DOCUMENTS 5,185,705 A * 2/1993 Farrington ............... H02H 3/00
361/115
5,446,354 A * 8/1995 Hiruma .................. G01R 31/34
318/400.09
(Continued)

*Primary Examiner* — Rajnikant B Patel
(74) *Attorney, Agent, or Firm* — Oliff PLC

(57) ABSTRACT

In a control circuit for controlling a power converter that includes a switch, a power supply circuit outputs electrical power, and a command generator generates a switching command that controls switching operations of the switch, based on the electrical power output from the power supply circuit. A failure mode determiner executes a determination of whether which of failure modes has occurred in the power supply circuit, and outputs a result of the determination. A switch controller selectively executes, based on the result of the determination, a first switch control task and a second switch control task. The first switch control task forcibly shuts down the switch independently of the switching command, and the second switch control task enables the switching operations of the switch to be continuously controlled based on the switching command.

13 Claims, 14 Drawing Sheets

(51) Int. Cl.
   *H02H 1/00*     (2006.01)
   *H02M 7/5387*   (2007.01)

(56) References Cited

U.S. PATENT DOCUMENTS

| | | | |
|---|---|---|---|
| 7,733,616 B2 * | 6/2010 | Yamada | B60L 3/0023 |
| | | | 318/432 |
| 8,928,298 B2 * | 1/2015 | Hsiao | H02J 7/1492 |
| | | | 323/282 |
| 9,018,881 B2 * | 4/2015 | Mao | G01R 31/346 |
| | | | 318/490 |
| 2015/0340977 A1 | 11/2015 | Tateda et al. | |

* cited by examiner

FIG.12

| LOCATION OF FAILURE | | | INPUT VOLTAGE | TEMPERATURE INFORMATION | POWER-SUPPLY CONTROL | SW CONTROL |
|---|---|---|---|---|---|---|
| POWER SUPPLY 41 | A1 | | $VB > Vinb$ | – | SHUTDOWN | SHUTDOWN |
| | B1 | | $VB \leq Vinb$ | – | CONTINUOUS CONTROL | ENABLING OF DRIVE |
| | C1 | V1r : OVERVOLTAGE ($V1r > V1U$) | – | $T1r > Tth1$ | SHUTDOWN | SHUTDOWN |
| | D1 | | – | $T1r \leq Tth1$ | CONTINUOUS CONTROL | ENABLING OF DRIVE |
| | E1 | | OPERATION BASED ON VB AND T1r | | SHUTDOWN | SHUTDOWN |
| | | | | | CONTINUOUS CONTROL | ENABLING OF DRIVE |
| | F1 | OVERCURRENT ($I1r > I1U$) | – | – | SHUTDOWN | ENABLING OF DRIVE |
| POWER SUPPLY 42 | A2 | | $V1r > Vin1$ | – | SHUTDOWN | SHUTDOWN |
| | B2 | | $V1r \leq Vin1$ | – | CONTINUOUS CONTROL | ENABLING OF DRIVE |
| | C2 | V2r : OVERVOLTAGE ($V2r > V2U$) | – | $T2r > Tth2$ | SHUTDOWN | SHUTDOWN |
| | D2 | | – | $T2r \leq Tth2$ | CONTINUOUS CONTROL | ENABLING OF DRIVE |
| | E2 | | OPERATION BASED ON V1r AND T2r | | SHUTDOWN | SHUTDOWN |
| | | | | | CONTINUOUS CONTROL | ENABLING OF DRIVE |
| | F2 | OVERCURRENT ($I2r > I2U$) | – | – | SHUTDOWN | ENABLING OF DRIVE |
| | G2 | LOWER VOLTAGE ($V2r < V2L$) | – | – | SHUTDOWN | SHUTDOWN |
| POWER SUPPLY 43 | A3 | | $V2r > Vin2$ | – | SHUTDOWN | SHUTDOWN |
| | B3 | | $V2r \leq Vin2$ | – | CONTINUOUS CONTROL | ENABLING OF DRIVE |
| | C3 | V3r : OVERVOLTAGE ($V3r > V3U$) | – | $T2r > Tth2$ | SHUTDOWN | SHUTDOWN |
| | D3 | | – | $T2r \leq Tth2$ | CONTINUOUS CONTROL | ENABLING OF DRIVE |
| | E3 | | OPERATION BASED ON V2r AND T2r | | SHUTDOWN | SHUTDOWN |
| | | | | | CONTINUOUS CONTROL | ENABLING OF DRIVE |
| | F3 | OVERCURRENT ($I3r > I3U$) | – | – | SHUTDOWN | ENABLING OF DRIVE |
| | G3 | LOWER VOLTAGE ($V3r < V3L$) | – | – | SHUTDOWN | SHUTDOWN |

CONTROL CIRCUIT FOR POWER CONVERTER

CROSS REFERENCE TO RELATED APPLICATIONS

This application is based on and claims the benefit of priority from Japanese Patent Application 2017-224083 filed on Nov. 21, 2017, the disclosure of which is incorporated in its entirety herein by reference.

TECHNICAL FIELD

The present disclosure relates to control circuits for a power converter including a switch.

BACKGROUND

Such a control circuit, which is disclosed in Japanese Patent Application Publication No. 2015-223050, is configured to forcibly shut down a switch of a power converter upon detecting a current failure that a current is not flowing correctly in a rotary electric machine electrically connected to the power converter via the switch.

SUMMARY

For example, such a control circuit is comprised of a power supply circuit and a command generator. The power supply circuit supplies electrical power to the command generator, and the command generator generates, based on the electrical power, a switching command, thus outputting the switching command to a switch connected between the power converter and the rotary electric machine. This enables the switch to be turned on or turned off.

In addition to such a current failure, various failures may occur in the control circuit, which include a failure occurring in the power supply circuit, which will be referred to as a power failure.

For addressing such a power failure in the power supply circuit, the control circuit can be configured to output a reset signal to the command generator upon determining that there is a power failure in the power supply circuit. The reset signal input to the command generator enables the command generator to be shut down, and thereafter the command generator is initialized. The shutdown of the command generator causes the switch to be indirectly turned off.

Unfortunately, it takes a short period until the command generator is completely shut down after the reset signal is input to the command generator. This may therefore result in the short period becoming an unguaranteed period for which normal operations of the control circuit cannot be guaranteed. For example, during the unguaranteed period, the command generator may carry out unexpected operations that could not be expected during design of the control circuit.

This may therefore result in the reliability of the power converter deteriorating during the unguaranteed period of the control circuit.

In view of the circumstances set forth above, an aspect of the present disclosure seeks to provide control circuits for a power converter, each of which enables the power converter to maintain higher reliability.

According to an exemplary aspect of the present disclosure, there is provided a control circuit for controlling a power converter that includes a switch. The control circuit includes a power supply circuit configured to output electrical power, and a command generator configured to generate a switching command that controls switching operations of the switch, based on the electrical power output from the power supply circuit. The control circuit includes a failure mode determiner configured to perform a determination of whether which of failure modes has occurred in the power supply circuit, and output a result of the determination. The control circuit includes a switch controller configured to selectively execute, based on the result of the determination, a first switch control task and a second switch control task. The first switch control task forcibly shuts down the switch independently of the switching command, and the second switch control task enables the switching operations of the switch to be continuously controlled based on the switching command.

The inventors of the present application have focused on the reason why normal operations of a conventional control circuit for controlling switching operations of a switch in accordance with a switching command cannot be guaranteed for the occurrence of a failure in a power supply circuit of the conventional control circuit is that shutdown of a command generator that generates the switching command causes the switch to be indirectly turned off.

From this inventor's focusing, the control circuit according to the exemplary aspect of the present disclosure includes the switch controller configured to selectively execute, based on the result of the determination, the first switch control task that forcibly shuts down the switch independently of the switching command upon the result of the determination representing, for example, that at least one of the failure modes has occurred in the power supply circuit.

This therefore enables the switch to be directly shut down even in the case of the occurrence of at least one of the failure modes in the power supply circuit. This therefore prevents the control circuit from becoming an unguaranteed state even in the case of the occurrence of at least one of the failure modes in the power supply circuit, enabling the power converter to maintain higher reliability.

This also makes shorter the time for which the switch has been shut down since the occurrence of at least one failure in the power supply circuit.

The inventors of the present application have considered that such a control circuit employs a configuration that the switch is always shut down each time a failure has occurred in the power supply circuit. This configuration may however cause control operations of the power converter to be limited. In view of this issue, the inventors of the present application have focused on the matter that there is a possibility of switching control of the switch being continued depending on which of the failure modes having occurred in the power supply circuit.

From this inventor's focusing, the switch controller of the control circuit according to the exemplary aspect is configured to selectively execute, based on the result of the determination, control circuit according to the exemplary aspect of the present disclosure the first switch control task and the second switch control task. The first switch control task forcibly shuts down the switch independently of the switching command, and the second switch control task enables the switching operations of the switch to be continuously controlled based on the switching command. This configuration therefore results in an increase of the opportunities for controlling the power converter even in the case of the occurrence of at least one of the failure modes in the power supply circuit, as compared with the configuration that the switch is always shut down each time a failure has occurred in the power supply circuit.

BRIEF DESCRIPTION OF THE DRAWINGS

Other aspects of the present disclosure will become apparent from the following description of an embodiment with reference to the accompanying drawings in which:

FIG. 12 is a table schematically illustrating in detail the mode determining routine according to the third embodiment;

DETAILED DESCRIPTION OF EMBODIMENT

Figure 1:
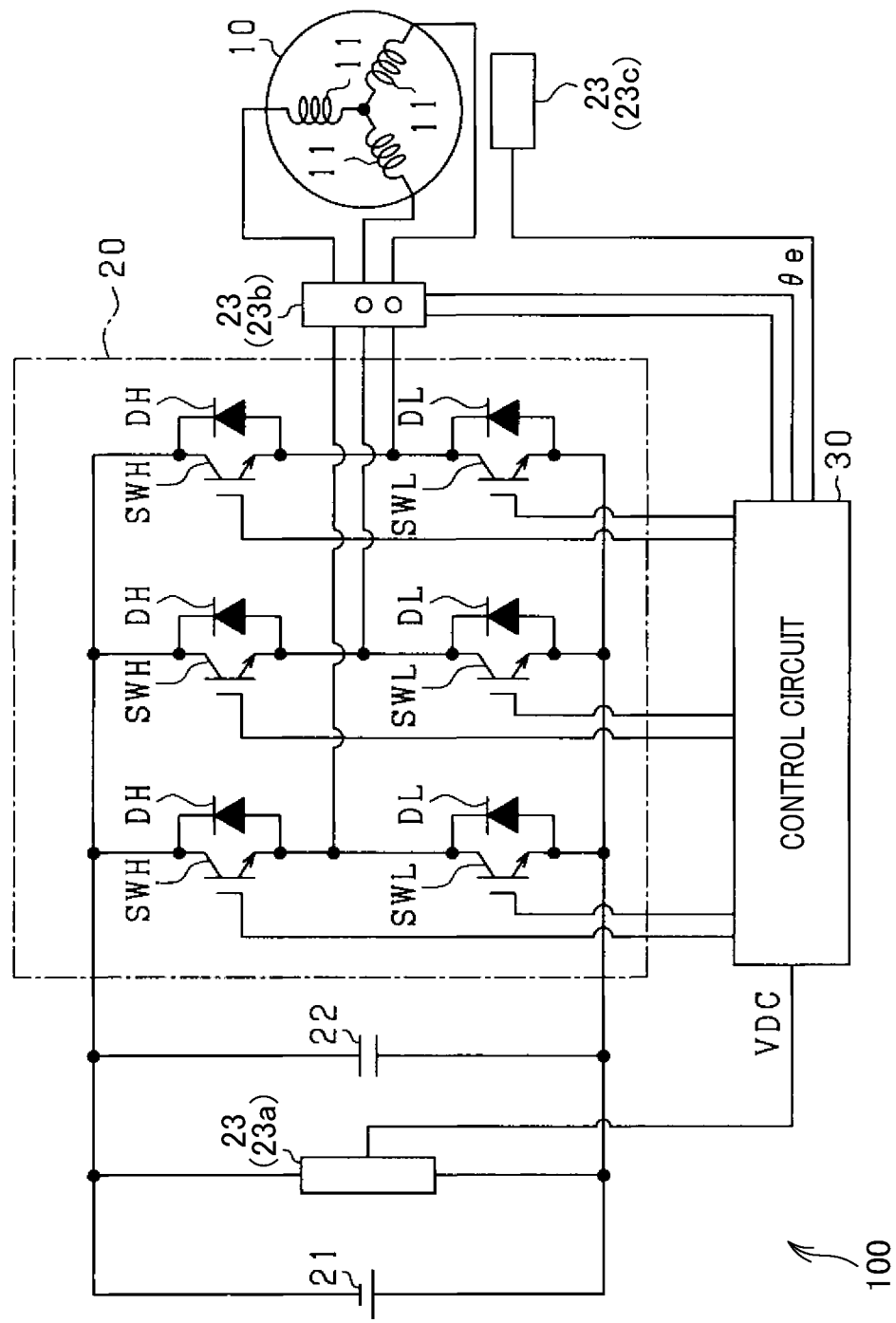
FIG. 1 is a circuit diagram schematically illustrating an example of the overall structure of a control system for an inverter according to the first embodiment of the present disclosure.

The following describes embodiments of the present disclosure with reference to the accompanying drawings. In the embodiments, like parts between the embodiments, to which like reference characters are assigned, are omitted or simplified to avoid redundant description.

First Embodiment

The following describes a control system 100 including an inverter 20, which is an example of a power converter, and a control circuit 30 for controlling the inverter 20 according to the first embodiment of the present disclosure. The control system 100 including the inverter 20 and the control circuit 30 is, for example, stored in a housing and installed in a vehicle, such as an electric vehicle or a hybrid vehicle.

As illustrated in FIG. 1, the control system 100 includes a rotary electric machine 10 in addition to the inverter 20 and the control circuit 30. The first embodiment uses a three-phase synchronous motor, such as three-phase interior permanent magnet synchronous motor, as the rotary electric machine 10. The first embodiment uses the rotary electric machine 10 as a main engine of the vehicle; the rotary electric machine 10 includes a rotor mechanically coupled to driving wheels (not shown) of the vehicle, so that the rotor and the driving wheels are capable of transferring rotational power between each other.

The rotary electric machine 10 includes three-phase windings, such as U-, V-, and W-phase windings 11.

The control system 100 also includes a high-voltage battery 21 connected to the rotary electric machine 10 via the inverter 20. The high-voltage battery 21 has an output voltage for example equal to or higher than 100 volts (V). The control system 100 additionally includes a smoothing capacitor 22 connected in parallel to the inverter 20 between the inverter 20 and the high-voltage battery 21.

The inverter 20 includes three pairs of series-connected upper- and lower-arm switches SWH and SWL corresponding to the respective three phases of the rotary electric machine 10.

The connection point between the upper- and lower-arm switches SWH and SWL for each phase is connected to a first end of a corresponding phase winding 11 of the rotary electric machine 10 via a bus. Second ends of the three-phase windings 11 are connected to a common junction, i.e. a neutral point, in, for example, a star-configuration (Y-configuration) such that the three-phase windings 11 have a phase difference of 120 electrical degrees from each other. Note that the first embodiment uses voltage-controlled semiconductor switches, such as IGBTs, as the respective switches SWH and SWL.

The inverter 20 includes freewheel diodes or flyback diodes DH connected in anti-parallel to the respective upper-arm switches SWH, and also includes freewheel diodes or flyback diodes DL connected in anti-parallel to the respective lower-arm switches SWL.

A collector, which is a high-side terminal of each upper-arm switch SWH, is connected to the positive terminal of the high-voltage battery 21 via a positive bus. An emitter, which is a low-side terminal of each lower-arm switch SWL, is connected to the negative terminal of the high-voltage battery 21 via a negative bus.

The control system 100 includes sensors 23 including, for example, a voltage sensor 23a, a current sensor 23b, and an angular sensor 23c. The voltage sensor 23a is for example arranged in parallel to the smoothing capacitor 22 between the high-voltage battery 21 and the smoothing capacitor 22. The voltage sensor 23a measures a voltage across the smoothing capacitor 22 as a power supply voltage VDC for the inverter 20; the power supply voltage VDC is based on a terminal voltage of the high-voltage battery 21. The voltage sensor 23a sends the measured power supply voltage VDC to the control circuit 30.

The current sensor 23b is arranged to measure at least two-phase currents flowing through the corresponding at least two-phase windings 11 of the rotary electric machine 10. Then, the current sensor 23b sends the measured at least two-phase currents to the control circuit 30.

The angular sensor 23c includes, for example, a resolver. The angular sensor 23c measures, i.e. monitors, a rotational angle, i.e. an electrical rotational angle, θe of the rotor of the rotary electric machine 10. Then, the angular sensor 23c sends the measured electrical angle θe to the control circuit 30. That is, these sensors 23a to 23c are provided outside the control circuit 30.

The control circuit 30 includes a microprocessor 50 that generates controlled switching commands for the respective switches SWH and SWL, and sends the switching commands to control terminals of the respective switches SWH and SWL, thus adjusting a controlled variable, such as output torque, of the rotary electric machine 10 to a target value.

In particular, the microcomputer 50 generates, for each phase, the switching commands for the respective switches SWH and SWL to thereby cause the switches SWH and SWL for each phase to be alternately turned on.

Figure 2:
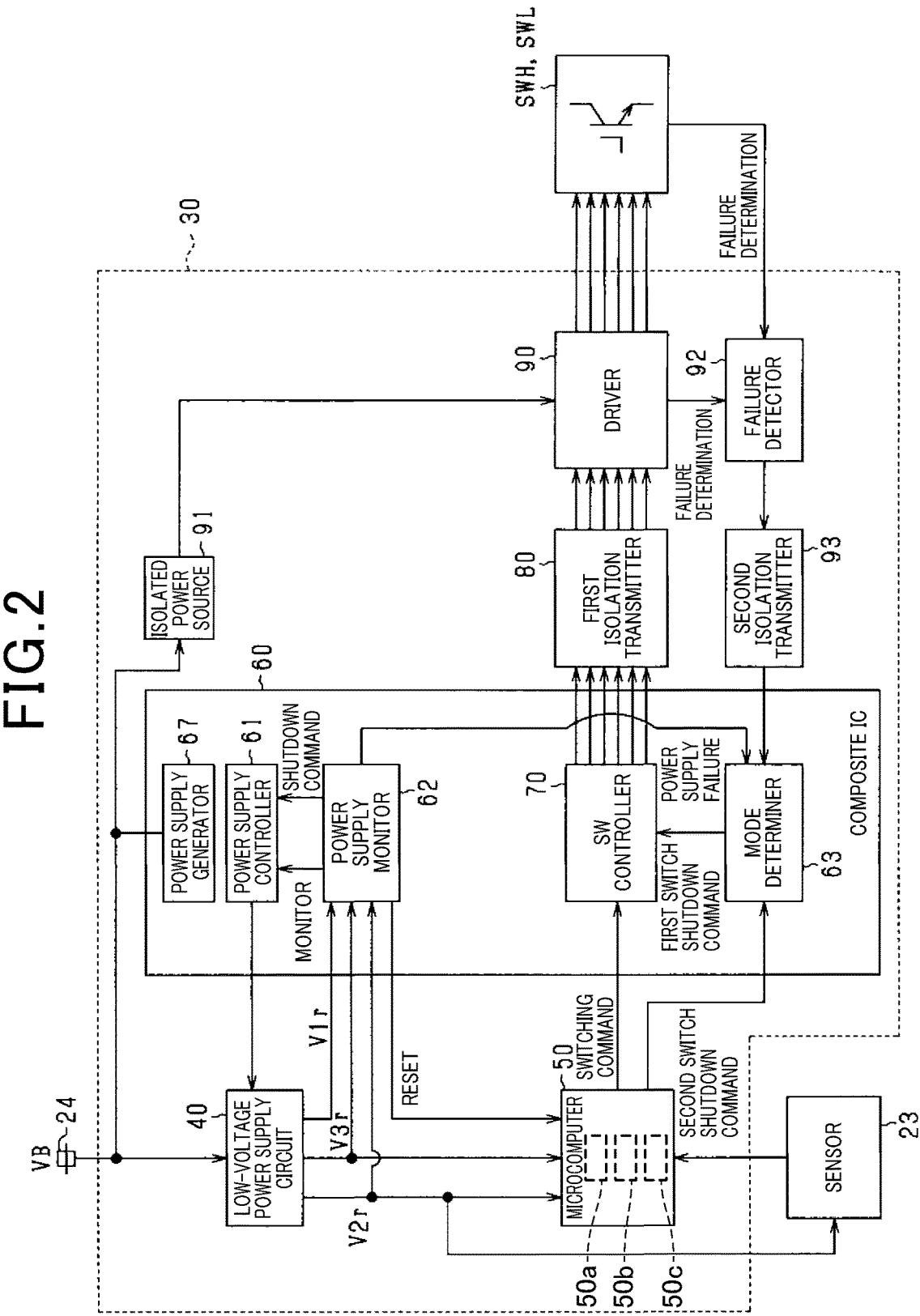
FIG. 2 is a block diagram schematically illustrating an example of the structure of a control circuit included in the control system illustrated in FIG. 1.

Next, the following describes an example of the structure of the control circuit 30 with reference to FIG. 2.

The control circuit 30 includes a low-voltage power supply circuit 40 and a composite integral circuit (IC) 60.

The composite IC 60 includes a power supply controller 61, a power supply monitor 62, and a power supply generator 67 mounted to the same chip.

The control circuit 30 is operated based on an output voltage VB of a low-voltage direct-current (DC) power source 24; the output voltage VB is lower than the output voltage of the high-voltage battery 21.

The low-voltage power supply circuit 40 is connected to the low-voltage DC power source 24, and operative to step down the output voltage VB of the low-voltage DC power source 24 to thereby generate, for example, at least three stepped down voltages, which are different from each other, as first to third output voltages described later.

The power supply controller 61 includes an internal power source that receives the first to third output voltages output from the low-voltage power supply circuit 40, and converts, for example, a selected one of the first to third output voltages to a predetermined voltage level on which the power supply controller 61 operates.

Specifically, the power supply controller 61, which operates based on the converted voltage level, controls the low voltage power supply circuit 40 to thereby adjust a value of the stepped-down voltage output from the low-voltage power supply circuit 40.

The power supply monitor 62 outputs a reset signal to the microcomputer 50 upon determining that a predetermined condition is satisfied. The predetermined condition will be described later.

Upon the reset signal being input to the microcomputer 50, the microcomputer 50 is shut down, i.e. all operations, i.e. all tasks, of the microcomputer are stopped, so that a task of generating the switching commands and a task of outputting the switching commands are stopped.

Figure 3:
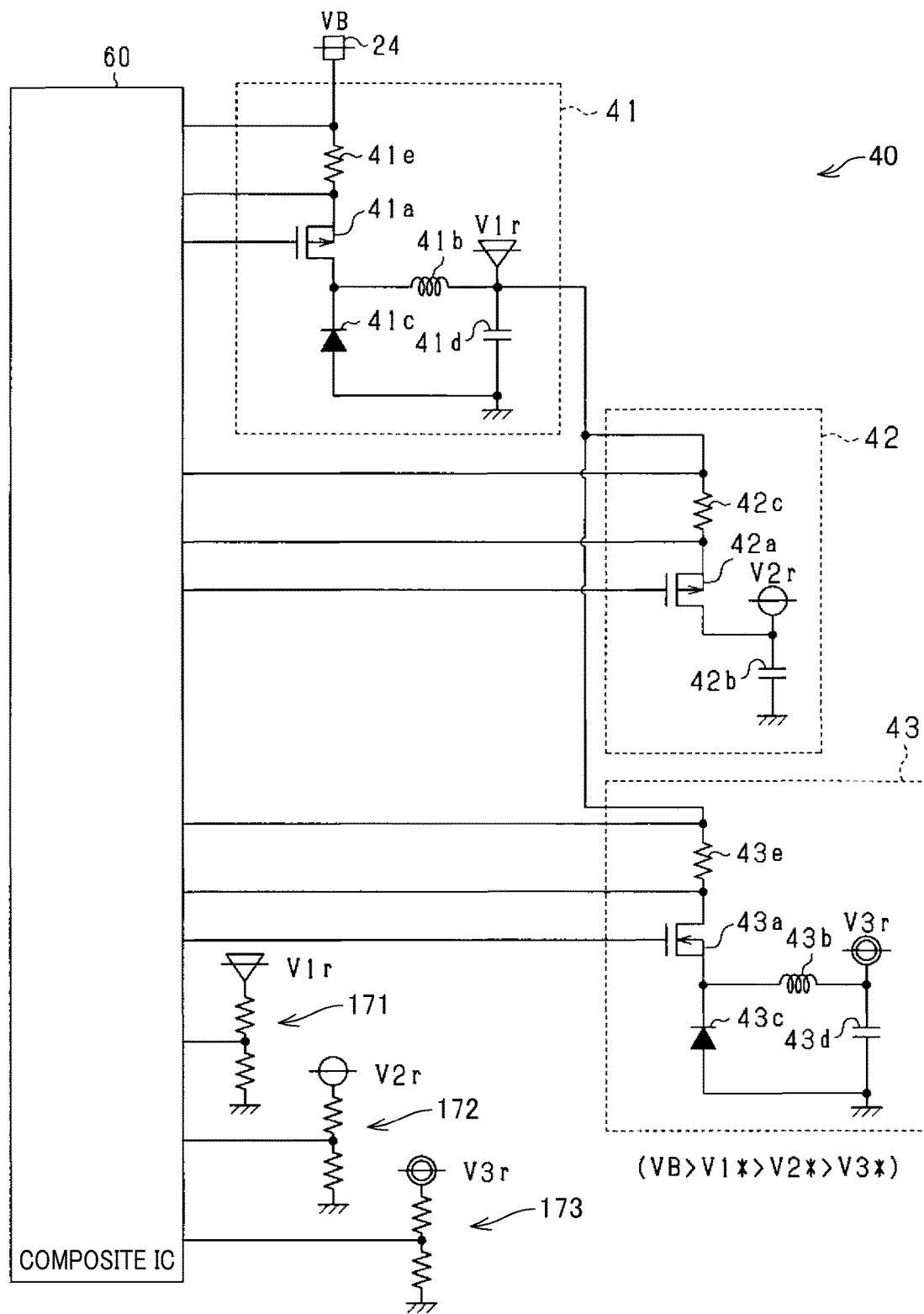
FIG. 3 is a circuit diagram schematically illustrating an example of the structure of a low-voltage power supply circuit illustrated in FIG. 2.

At least part of all functions provided by the control circuit 30 can be implemented by at least one processor; the at least one processor can be comprised of (1) The combination of at least one programmed processor, i.e. at least one programmed logic circuit, and at least one memory (2) At least one hardwired logic circuit (3) At least one hardwired-logic and programmed-logic circuit Referring to FIG. 3, the low-voltage power supply circuit 40 includes a first power supply circuit 41, a second power supply circuit 42, and a third power supply circuit 43.

The first power supply circuit 41 is comprised of, for example, a first switch 41a, a first inductor 41b, a first diode 41c, a first capacitor 41d, and a first current-sensitive resistor 41e.

The first power supply circuit 41 is designed as a switching regulator for stepping down the output voltage VB of the low-voltage DC power source 24. A P-channel MOSFET can be used as the first switch 41a according to the first embodiment.

The first current-sensitive resistor 41e has opposing first and second ends. The first end of the first current-sensitive resistor 41e is connected to the low-voltage DC power source 24, and the second end of the first current-sensitive resistor 41e is connected to a first main terminal, i.e. the source, of the first switch 41a. A second main terminal, i.e. the drain, of the first switch 41a is connected to the cathode of the first diode 41c.

The first capacitor 41d has opposing first and second ends, and the first inductor 41b has opposing first and second ends. The first end of the first capacitor 41d is connected to the first end of the first inductor 41d, and the second end of the first inductor 41d is connected to a connection line between the second main terminal of the first switch 41a and the cathode of the first diode 41c. The second end of the first capacitor 41d and the anode of the first diode 41c are commonly connected to a common signal ground.

The connection point between the first end of the first capacitor 41d and the first end of the first inductor 41b serves as an output terminal of the first power supply circuit 41; the output terminal of the first power supply circuit 41 is connected to each of the second and third power supply circuits 42 and 43.

The first power supply circuit 41 is configured to output, based on the output voltage VB of the low-voltage DC power source 24, a voltage across the first capacitor 41d as a first output voltage V1r; the first output voltage V1r serves as an input voltage to each of the second and third power supply circuits 42 and 43.

The first power supply circuit 41 include a first output monitor, such as a voltage divider, 171. The first output monitor 171 is configured to divide the first output voltage V1r into a divided voltage.

The divided voltage monitored by the first output monitor 171 is input to the power supply monitor 62 of the composition IC 60. In addition, the power supply monitor 62 measures a first current I1r flowing through the first switch 41a as a function of a voltage across the current-sensitive resistor 41e and a resistance value of the current-sensitive resistor 41e.

A control terminal, such as the gate, of the first switch 41a is connected to the power supply controller 61 of the composition IC 60.

The power supply controller 61 is configured to adjust a voltage at the control terminal, i.e. the gate, of the first switch 41a using a predetermined reference voltage to thereby execute feedback control of the first output voltage V1r to a first target voltage V1*. Specifically, the power supply controller 61 and the power supply monitor 62 serve as a feedback control system with an error amplification function in which the power supply controller 61 performs on-off switching operations of the first switch 41a to thereby control a duty factor, i.e. a duty cycle, of the first switch 41a, thus adjusting the first output voltage V1r to the first target voltage V1*. The duty factor for a switch represents a controllable ratio, i.e. percentage, of an on duration of the switch to a total duration of a predetermined switching period. The first target voltage V1* is set to, for example, 6 V, which is lower than the output voltage VB of the low-voltage DC power source 24.

The second power supply circuit 42 is comprised of, for example, a second switch 42a, a second capacitor 42b, and a second current-sensitive resistor 42c.

The second power supply circuit 42 is designed as a series regulator provided at the downstream of the first power supply circuit 41 and configured to step down the first output voltage V1r, thus outputting a stepped down voltage to the microcomputer 50 as a second output voltage V2r. A P-channel MOSFET can be used as the second switch 42a according to the first embodiment.

The second current-sensitive resistor 42c has opposing first and second ends. The first end of the second current-sensitive resistor 42c is connected to the first end of the first capacitor 41d, and the second end of the second current-sensitive resistor 42c is connected to a first main terminal, i.e. the source, of the second switch 42a. The second capacitor 42b has opposing first and second ends. A second main terminal, i.e. the drain, of the second switch 42a is connected to the first end of the second capacitor 42b. The second end of the second capacitor 42b is connected to the common signal ground.

The second power supply circuit 42 is configured to output, based on the first output voltage V1r, a voltage across the second capacitor 42b as a second output voltage V2r; the second output voltage V2r is input to the microcomputer 50.

The second power supply circuit 42 includes a second output monitor, such as a voltage divider, 172. The second output monitor 172 is configured to divide the second output voltage V2r into a divided voltage.

The divided voltage monitored by the second output monitor 172 is input to the power supply monitor 62 of the composition IC 60. In addition, the power supply monitor 62 measures a second current I2r flowing through the second switch 42a as a function of a voltage across the current-sensitive resistor 42c and a resistance value of the current-sensitive resistor 42c.

A control terminal, such as the gate, of the second switch 42a is connected to the power supply controller 61 of the composition IC 60.

The power supply controller 61 is configured to adjust a voltage at the control terminal, i.e. the gate, of the second switch 42a using the predetermined reference voltage to thereby execute feedback control of the second output voltage V2r to a second target voltage V2*. Specifically, the power supply controller 61 and the power supply monitor 62 serve as the feedback control system with the error amplification function in which the power supply controller 61 performs on-off switching operations of the second switch 42a to thereby control the on resistance of the second switch 42a, thus adjusting the second output voltage V2r to the second target voltage V2*. As another example, the power supply controller 61 can perform on-off switching operations of the second switch 42a to thereby control the duty factor of the second switch 42a, thus adjusting the second output voltage V2r to the second target voltage V2*. The second target voltage V2* is set to, for example, 5 V, which is lower than the first target voltage V1*.

The third power supply circuit 43 is comprised of, for example, a third switch 43a, a third inductor 43b, a third diode 43c, a third capacitor 43d, and a third current-sensitive resistor 43e.

The third power supply circuit 43 is designed as a switching regulator for stepping down the first output voltage V1. An N-channel MOSFET can be used as the third switch 43a according to the first embodiment.

The third current-sensitive resistor 43e has opposing first and second ends. The first end of the third current-sensitive resistor 43e is connected to the first end of the third capacitor 43d, and the second end of the third current-sensitive resistor 43e is connected to a first main terminal, i.e. the drain, of the third switch 43a. A second main terminal, i.e. the source, of the third switch 43a is connected to the cathode of the third diode 43c.

The third capacitor 43d has opposing first and second ends, and the third inductor 43b has opposing first and second ends. The first end of the third capacitor 43d is connected to the first end of the third inductor 43d, and the second end of the third inductor 43d is connected to a connection line between the second main terminal of the third switch 43a and the cathode of the third diode 43c. The second end of the third capacitor 43d and the anode of the third diode 43c are commonly connected to the common signal ground.

The connection point between the first end of the third capacitor 43d and the first end of the third inductor 43b serves as an output terminal of the third power supply circuit 43; the output terminal of the third power supply circuit 43 is connected to, for example, the microcomputer 50.

The third power supply circuit 43 is configured to output, based on the first output voltage V1r, a voltage across the third capacitor 43d as a third output voltage V3r; the third output voltage V3r is input to the microcomputer 50.

The third power supply circuit 43 include a third output monitor, such as a voltage divider, 173. The third output monitor 173 is configured to divide the third output voltage V3r into a divided voltage.

The divided voltage monitored by the third output monitor 173 is input to the power supply monitor 62 of the composition IC 60. In addition, the power supply monitor 62 measures a third current I3r flowing through the third switch 43a as a function of a voltage across the current-sensitive resistor 43e and a resistance value of the current-sensitive resistor 43e.

A control terminal, such as the gate, of the third switch 43a is connected to the power supply controller 61 of the composition IC 60.

The power supply controller 61 is configured to adjust a voltage at the control terminal, i.e. the gate, of the third switch 43a using the predetermined reference voltage to thereby execute feedback control of the third output voltage V3r to a third target voltage V3*. Specifically, the power supply controller 61 and the power supply monitor 62 serve as the feedback control system with the error amplification function in which the power supply controller 61 performs on-off switching operations of the third switch 43a to thereby control the duty factor of the third switch 43a, thus adjusting the third output voltage V3r to the third target voltage V3*. The third target voltage V3* is set to, for example, 1.2 V, which is lower than the second target voltage V2*.

The microcomputer 50 is comprised of, for example a CPU 50a, a memory 50b, and a peripheral circuit 50c including, for example, an input/output interface and an analog-to-digital (A/D) converter. To the CPU 50a, the third output voltage V3r of the third power supply circuit 43 is supplied. To the peripheral circuit 50c, the second output voltage V2r of the second power supply circuit 42 is supplied. The second output voltage V2r is also supplied to each of the sensors 23a to 23c, so that each of the sensors 23a to 23c is configured to operate based on the second output voltage V2r.

In addition, as illustrated in FIG. 2, the control circuit 30 includes a first isolation transmitter 80, drivers 90 provided for the respective switches SWH and SWL, an isolated power source 91, a failure detector 92, and a second isolation transmitter 93. The first embodiment uses photocouplers for the first isolation transmitter 80, and also uses a photocoupler for the second isolation transmitter 93.

That is, the first isolation transmitter 80 is comprised of photocouplers PCU provided for the respective switches SWH and SWL. The photocoupler PCU serving as each first isolation transmitter 80 is comprised of a photodiode and a phototransistor optically coupled to each other while being electrically isolated from each other; a simple example of the structure of each photocoupler PCU will be described later.

The isolated power source 91 is comprised of an input unit and an output unit that are communicable with each other while being electrically isolated from each other. Specifically, the isolated power source 91 receives the output voltage VB of the low-voltage DC power source 24, and supplies a predetermined power supply voltage based on the output voltage VB to each the drive circuits 90.

Each of the drivers 90 is configured to operate based on the corresponding power supply voltage supplied from the isolated power source 91. That is, the control circuit 30 according to the first embodiment uses six drivers 90 for the respective six switches SWH and SWL.

The composite IC 60 has terminals Tr whose number corresponds to, for example, the number of the switches SWH and SWL, and additionally includes a switch controller 70 and a mode determiner 63 mounted to the same chip.

The switch controller 70 is operative to receive the switching commands for the respective switches SWH and SWL sent from the microcomputer 50, and transfer shutdown command based on the respective switching commands to the respective drivers 90 via the first isolation transmitter 80. Note that the power supply monitor 62 and the mode determiner 63 serve as, for example, a circuit determiner.

Figure 4:
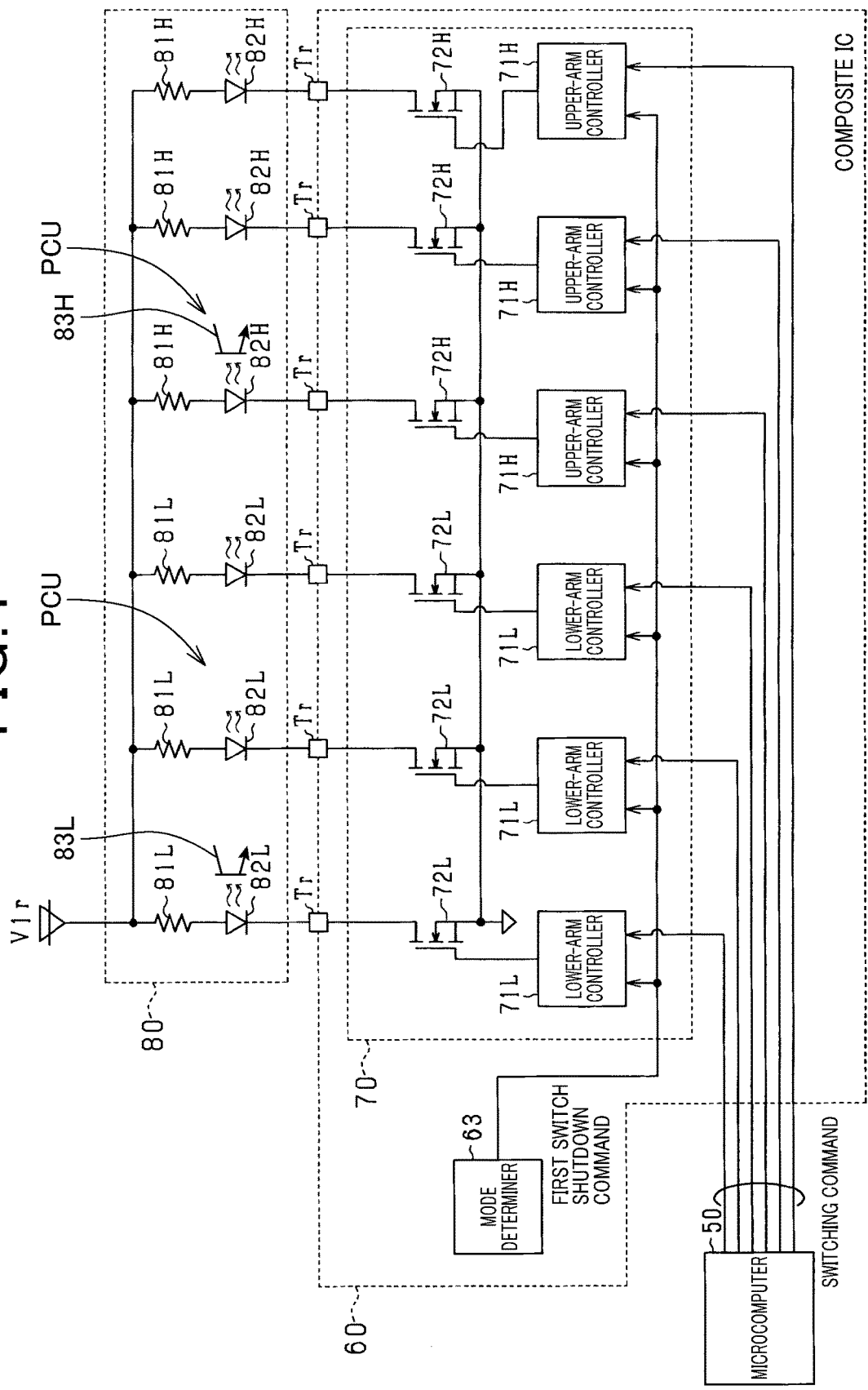
FIG. 4 is a circuit diagram schematically illustrating an example of the structure of each of a switch controller and a first isolation transmitter illustrated in FIG. 2.

FIG. 4 schematically illustrates an example of the structure of each of the switch controller 70 and the first isolation transmitter 80.

The switch controller 70 is comprised of upper-arm controllers 71H and high-side switches 72H corresponding to the respective upper-arm switches SWH. The switch controller 70 is also comprised of lower-arm controllers 71L and low-side switches 72L corresponding to the respective lower-arm switches SWL.

The first embodiment uses an N-channel MOSFET as each of the high- and low-side switches 72H and 72L.

The photocoupler PCU for each upper-arm switch SWH is comprised of an upper-arm resistor 81H, an upper-arm photodiode 82H, and a phototransistor 83H. The photocoupler PCU for each lower-arm switch SWL is also comprised of a lower-arm resistor 81L, a lower-arm photodiode 82L, and a phototransistor 83L.

In the photocoupler PCU for each upper-arm switch SWH, the upper-arm resistor 81H has opposing first and second ends, and the first end of the upper-arm resistor 81H is connected to the first end of the first capacitor 41d. This enables the first output voltage V1r to be applied to the upper-arm resistor 81H. The second end of the upper-arm resistor 81H is connected to the anode of the photodiode 82H. The cathode of the photodiode 82H is connected to a first main terminal, i.e. the drain, of the corresponding high-side switch 72H via the corresponding terminal Tr. A second main terminal, i.e. the source, of the high-side switch 72H is connected to the common signal ground.

In the photocoupler PCU for each upper-arm switch SWH, the phototransistor 83H is optically coupled to the corresponding photodiode 82H while being electrically isolated from the corresponding photodiode 82H. The phototransistor 83H of the photocoupler PCU for each upper-arm switch SWH is connected to the corresponding driver 90.

In the photocoupler PCU for each lower-arm switch SLH, the lower-arm resistor 81L has opposing first and second ends, and the first end of the lower-arm resistor 81L is connected to the first end of the first capacitor 41d. This enables the first output voltage V1r to be applied to the lower-arm resistor 81L. The second end of the lower-arm resistor 81L is connected to the anode of the photodiode 82L. The cathode of the photodiode 82L is connected to a first main terminal, i.e. the drain, of the corresponding low-side switch 72L via the corresponding terminal Tr. A second main terminal, i.e. the source, of the low-side switch 72L is connected to the common signal ground.

In the photocoupler PCU for each lower-arm switch SWL, the phototransistor 83L is optically coupled to the corresponding photodiode 82L while being electrically isolated from the corresponding photodiode 82L. The phototransistor 83L of the photocoupler PCU for each lower-arm switch SWL is connected to the corresponding driver 90.

The high-side switch 72H for each upper-arm switch SWH has a control terminal, such as the gate, and the control terminal of the high-side switch 72H is connected to the corresponding upper-arm controller 71H.

The switching command for each upper-arm switch SWH representing a turn-on command, i.e. having a logical high level, is input to the corresponding upper-arm controller 71H. This causes the upper-arm controller 71H to turn on the corresponding high-side switch 71H in response to the switching command input thereto to thereby enable the corresponding photodiode 82H to emit light based on the first output voltage V1r upon it being determined that no first switch shutdown command, which will be described later, has been input to the upper-arm controller 71H.

This causes the phototransistor 83H corresponding to the photodiode 82H to output an on command, such as a logical high level signal, to the corresponding driver 90. This causes the driver 90 to turn on the corresponding upper-arm switch SWH.

The upper-arm controller 71H for example maintains the on state of the high-side switch 71H while the switching command is kept in the logical high level, so that the on command is output to the corresponding driver 90 while the switching command is kept in the logical high level.

In contrast, the switching command for each upper-arm switch SWH representing a shutdown command, i.e. having a logical low level, is input to the corresponding upper-arm controller 71H. This causes the upper-arm controller 71H to shut down the corresponding high-side switch 72H in response to the switching command input thereto to thereby disable the corresponding photodiode 82H from emitting light based on the first output voltage V1r. This causes the phototransistor 82H corresponding to the photodiode 82H to output an off command, such as a logical low level signal, to the corresponding driver 90. This causes the driver 90 to shut down the corresponding upper-arm switch SWH.

The upper-arm controller 71H for example maintains the off state of the low-side switch 71L while the switching command is kept in the logical low level, so that the off command is output to the corresponding driver 90 while the switching command is kept in the logical low level.

As described later, the mode determiner 63 is capable of outputting a first switch shutdown command to the upper-arm controller 71H for each upper-arm switch SWH. Upon determining that the first switch shutdown command is input to the upper-arm controller 71H, the upper-arm controller 71H forcibly turns off the high-side switch 72H or forcibly maintains the high-side switch 72H in the off state independently of the switching command input thereto. This enables the off command to be transmitted from the first isolation transmitter 80 to each driver 90, so that the corresponding upper-arm switch SWH is forcibly turned off or maintained in the off state.

The low-side switch 72L for each lower-arm switch SWL has a control terminal, such as the gate, and the control terminal of the low-side switch 72L is connected to the corresponding lower-arm controller 71L.

The switching command for each lower-arm switch SWL representing a turn-on command, i.e. having a logical high level, is input to the corresponding lower-arm controller 71L. This causes the lower-arm controller 71L to turn on the corresponding low-side switch 71L in response to the switching command input thereto to thereby enable the corresponding photodiode 82L to emit light based on the first output voltage V1$r$ upon it being determined that no first switch shutdown command is input to the lower-arm controller 71L.

This causes the phototransistor 83L corresponding to the photodiode 82L to output an on command, such as a logical high level signal, to the corresponding driver 90. This causes the driver 90 to turn on the corresponding lower-arm switch SWL.

The lower-arm controller 71L for example maintains the on state of the high-side switch 71L while the switching command is kept in the logical high level, so that the on command is output to the corresponding driver 90 while the switching command is kept in the logical high level.

In contrast, the switching command for each lower-arm switch SWL representing a shutdown command, i.e. having a logical low level, is input to the corresponding lower-arm controller 71L. This causes the lower-arm controller 71L to shut down the corresponding low-side switch 72L in response to the switching command input thereto to thereby disable the corresponding photodiode 82L from emitting light based on the first output voltage V1$r$. This causes the phototransistor 82L corresponding to the photodiode 82L to output an off command, such as a logical low level signal, to the corresponding driver 90. This causes the driver 90 to shut down the corresponding lower-arm switch SWL.

The lower-arm controller 71L for example maintains the off state of the low-side switch 71L while the switching command is kept in the logical low level, so that the off command is output to the corresponding driver 90 while the switching command is kept in the logical low level.

As described later, the mode determiner 63 is capable of outputting the first switch shutdown command to the lower-arm controller 71L for each lower-arm switch SWL.

Upon determining that the first switch shutdown command is input to the lower-arm controller 71L, the lower-arm controller 71L forcibly turns off the low-side switch 72L or forcibly maintains the low-side switch 72L in the off state independently of the switching command input thereto. This enables the off command to be transmitted from the first isolation transmitter 80 to each driver 90, so that the corresponding lower-arm switch SWL is forcibly turned off or maintained in the off state.

Note that the polarity of each logical level for the turn-on command and the polarity of each logical level for the shutdown command described above in accordance with FIG. 4 can be exchanged with one another.

Referring to FIG. 2, the failure detector 92 is configured to determine whether at least one of switch-related failures has occurred in at least one of the drivers 90, the upper-arm switches SWH, and the lower-arm switches SWL. Upon determining that at least one of the switch-related failures has occurred in at least one of the drivers 90, the upper-arm switches SWH, and the lower-arm switches SWL, the failure detector 92 transmits a failure signal to the mode determiner 63 of the composite IC 63 via the second isolation transmitter 93 while electrically isolating the failure detector 92 and the composite IC 60.

Upon determining that the failure signal is input to the mode determiner 63, the mode determiner 63 transmits the first switch shutdown command to each of the upper-arm controllers 71H and the lower-arm controllers 71L. This causes each of all the upper-arm controllers 71H and the lower-arm controllers 71L to forcibly shut down the corresponding one of the high- and low-side switches 72H and 72L, resulting in all the upper- and lower-arm switches SWH and SWL being immediately turned off or maintained in the off state while the microcomputer 50 is in the operating state.

For example, the switch-related failures that may occur in at least one of the upper- and lower-arm switches SWH and SWL include (1) An overcurrent failure indicative of the phase current of the corresponding switch having exceeded a predetermined overcurrent threshold (2) A temperature failure indicative of the temperature of the corresponding switch having exceeded a predetermined temperature threshold (3) An inter-terminal voltage failure, i.e. a collector-emitter voltage failure, of the corresponding switch having deviated from a predetermined allowable voltage range for the inter-terminal voltage, i.e. the collector-emitter voltage, of the corresponding switch For example, if each switch SWH, SWL incorporates therein a current sense function, the failure detector 92 of the control circuit 30 can be configured to determine whether a current flowing through each switch SWH, SWL or a current-relative parameter, sensed by the current sense function has exceeded the predetermined overcurrent threshold. This makes it possible for the failure detector 92 to determine whether an overcurrent failure has occurred in at least one of the switches SWH and SWL.

Note that the collector-emitter voltage of each switch SWH, SWL has a predetermined correlation with a current flowing through the corresponding switch, so that the collector-emitter voltage failure where the collector-emitter voltage has deviated from the allowable range is another form of the overcurrent failure. That is, this makes it possible for the failure detector 92 to determine whether an overcurrent failure has occurred, i.e. a collector-emitter voltage failure has occurred, in each switch SWH, SWL in accordance with the collector-emitter voltage across the corresponding switch SWH, SWL.

Moreover, each switch SWH, SWL incorporates therein a temperature-sensitive sensor, such as temperature-sensitive diode, for measuring the temperature of the corresponding switch SWH, SWL. At that time, the failure detector 92 of the control circuit 30 can determine whether the temperature of each switch SWH, SWL measured by the temperature-sensitive sensor has exceeded the predetermined temperature threshold. This makes it possible for the failure detector 92 to determine whether a temperature failure has occurred in at least one of the switches SWH and SWL.

Additionally, the switch-related failures that may occur in at least one of the drivers 91 include (1) An output failure indicative of no power being output from the isolated power source 91 to the drivers 90

(2) An excessive low voltage failure indicative of the output voltage from the isolated power source 91 to the drivers 90 being lower than a predetermined lower limit threshold (3) An overvoltage failure indicative of the output voltage from the isolated power source 91 to the drivers 90 being higher than a predetermined overvoltage threshold (4) A voltage fluctuation failure indicative of the range, i.e. the upper limit, of fluctuation of the output voltage from the isolated power source 91 to the drivers 90 having exceeded a predetermined allowable range, i.e. a predetermined allowable upper limit For example, the failure detector 92 of the control circuit 30 can be configured to obtain the output voltage from the isolated power source 91 to the drivers 90. Then, the failure detector 92 is configured to deter mine whether (1) There is an output failure based on the obtained output voltage (2) There is an excessive low voltage failure based on the obtained output voltage and the lower limit threshold (3) There is an overvoltage failure based on the obtained output voltage and the overvoltage threshold (4) There is a voltage fluctuation failure based on the obtained output voltage and the allowable range The microcomputer 50 is configured to determine whether at least one of failures has occurred in at least one of the sensors 23a to 23c and the microcomputer 50 itself. Upon determining that at least one of the failures has occurred in at least one of the sensors 23a to 23c and the microcomputer 50, the microcomputer 50 stops generation and output of the switching commands, and outputs a second switch shutdown signal to the mode determiner 63. These failures will be referred to as microcomputer/sensor-related failures.

The microcomputer/sensor-related failures that may occur in at least one of the sensors 23a to 23c include (1) An output failure indicative of no signal being output from at least one of the sensors 23a to 23c to the microcomputer 50

(2) An excessive low-level failure indicative of the output signal from at least one of the sensors 23a to 23c to the microcomputer 50 being lower than a predetermined first lower limit threshold level to the microcomputer 50

(3) An excessive high-level failure indicative of the output signal from at least one of the sensors 23a to 23c being higher than a predetermined higher limit threshold level to the microcomputer 50

(4) An output characteristic failure in at least one of the sensors 23a to 23c

For example, the microcomputer 50 can include a reference output characteristic curve for the output signal of each of the sensors 23a to 23c, and can determine whether a level of deviation of an actual output characteristic curve obtained based on the output signal from the corresponding sensor from the corresponding reference output characteristic curve is greater than a predetermined threshold level.

Upon determining that the level of deviation of the actual output characteristic curve of at least one sensor from the corresponding reference output characteristic curve is greater than the predetermined threshold level, the microcomputer 50 can determine that there is an output characteristic failure in the at least one sensor.

In addition, the microcomputer 50 can be configured to include a known diagnostic unit 50a for cyclically self-diagnosing whether a failure has occurred therein in accordance with, for example, checking operations of its CPU and memory. Alternatively, the microcomputer 50 can be connected to an external diagnostic unit 50b (see a virtual line in FIG. 2) for cyclically diagnosing whether a failure has occurred in the microcomputer 50 in accordance with, for example, checking operations of the CPU and memory of the microcomputer 50. That is, the microcomputer 50a determines whether a microcomputer/sensor-related failure has occurred therein in accordance with a diagnostic result cyclically sent from the external diagnostic unit 50b.

The mode determiner 63 transmits the first switch shutdown command to each of the upper-arm controllers 71H and the lower-arm controllers 71L upon determining that there is a failure in the microcomputer 50. This causes each of all the upper-arm controllers 71H and the lower-arm controllers 71L to forcibly shut down the corresponding one of the high- and low-side switches 72H and 72L, resulting in all the upper- and lower-arm switches SWH and SWL being immediately turned off or maintained in the off state while the microcomputer 50 is in the operating state.

The power supply monitor 62 has a function of cyclically monitoring how the power supply controller 61 operates to thereby cyclically determine, based on the results of the monitoring, whether at least one of failures has occurred in the power supply controller 61, i.e. in the control operations of the power supply controller 61. The power supply monitor 62 cyclically sends the results of the monitoring to the mode determiner 63.

The mode determiner 63 transmits the first switch shutdown command to each of the upper-arm controllers 71H and the lower-arm controllers 71L upon determining, based on the results of the monitoring, that there is at least one of the failures in the power supply controller 61. This causes each of all the upper-arm controllers 71H and the lower-arm controllers 71L to forcibly shut down the corresponding one of the high- and low-side switches 72H and 72L, resulting in all the upper- and lower-arm switches SWH and SWL being immediately turned off or maintained in the off state while the microcomputer 50 is in the operating state.

The failures that may occur in the power supply controller 61 include (1) An internal power-source failure indicative of a malfunction in the internal power source of the power supply controller 61

(2) A temperature failure indicative of the temperature of the power supply circuit 61 having deviated from a predetermined allowable temperature range (3) A reference-voltage failure indicative of the reference voltage used by the power supply controller 61 for control of each switch 41a, 42a, and 43a having deviated from a predetermined allowable voltage range That is, the power supply monitor 62 determines whether an internal power-source failure has occurred in the internal power source of the power supply controller 61.

In addition, the power supply monitor 62 monitors the temperature of the power supply controller 61 to thereby determine whether a temperature failure has occurred in the power supply controller 61. Moreover, the power supply monitor 62 monitors the reference voltage to thereby determine whether a reference-voltage failure has occurred in the reference voltage of the power supply controller 61.

Then, the power supply monitor 62 sends, to the mode determiner 63, the results of the monitoring including whether an internal power-source failure has occurred, whether a temperature failure has occurred, and whether a reference-voltage failure has occurred in the power supply controller 61.

Figure 5:
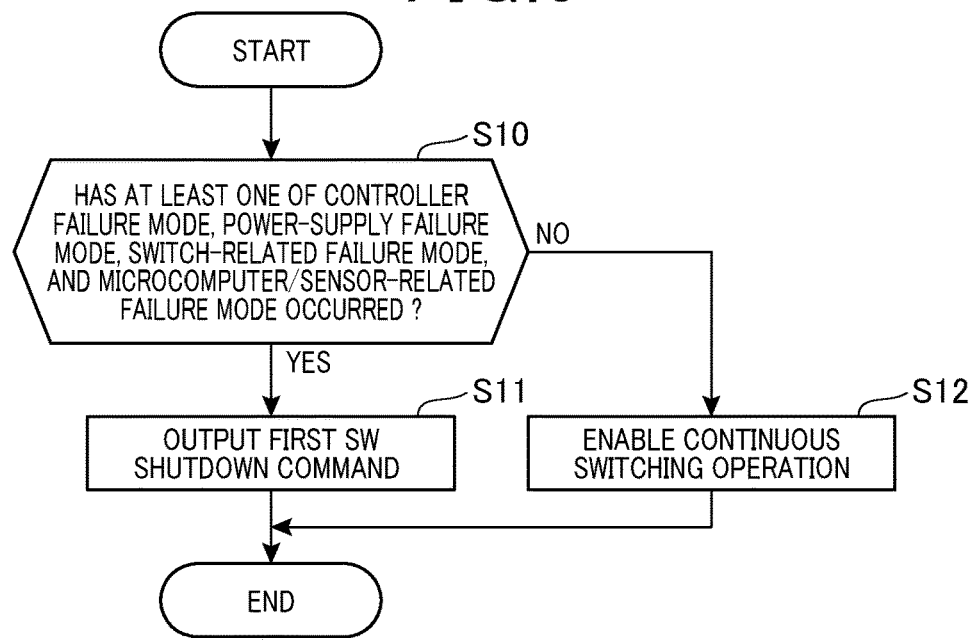
FIG. 5 is a flowchart schematically illustrating a mode determining routine according to the first embodiment.

Next, the following describes a failure mode determining routine carried out by the mode determiner 63 for example every predetermined period with reference to FIG. 5.

Upon starting the failure mode determining routine, the mode determiner 63 deter mines whether at least one of a controller failure mode, a power-supply circuit failure mode, a switch-related failure mode, and a microcomputer/sensor-related failure mode has occurred in the control circuit 30 or its peripheral devices including the sensors 23 in step S10.

The controller failure mode includes at least one of the internal power-source failure, temperature failure, and reference-voltage failure that may occur in the power supply controller 61. That is, the mode determiner 63 determines whether the controller failure mode has occurred in the power supply controller 61 in accordance with the results of monitoring for the power supply controller 61 sent from the power supply monitor 62.

The power-supply circuit failure mode includes at least one of failures in the first power supply circuit 41, second output-voltage failures in the second power supply circuit 42, and failures in the third power supply circuit 43.

The failures, which will be referred to as first power-supply failures, that may occur in the first power supply circuit 41 include (1) A zero-voltage failure indicative of the first output voltage V1r being zero (2) An excessive low voltage failure indicative of the first output voltage V1r being lower than a predetermined first lower voltage threshold V1L that is set to be higher than zero (3) An overvoltage failure indicative of the first output voltage V1r being higher than a predetermined first overvoltage threshold V1U that is set to be higher than zero (4) A voltage fluctuation failure indicative of the level of fluctuation of the first output voltage V1r having exceeded a predetermined first level (5) An overcurrent failure indicative of a first current I1r flowing through the first switch 41a being higher than a predetermined first overcurrent threshold I1U The first lower voltage threshold V1L is for example set to a lower limit of a predetermined operation guarantee voltage range of the second power supply circuit 42, and the first overvoltage threshold V1U is for example set to an upper limit of the predetermined operation guarantee voltage range of the second power supply circuit 42.

The failures, which will be referred to as second power-supply failures, that may occur in the second power supply circuit 42 include (1) A zero-voltage failure indicative of the second output voltage V2r being zero (2) An excessive low voltage failure indicative of the second output voltage V2r being lower than a predetermined second lower voltage threshold V2L that is set to be higher than zero (3) An overvoltage failure indicative of the second output voltage V2r being higher than a predetermined second overvoltage threshold V2U that is set to be higher than zero (4) A voltage fluctuation failure indicative of the level of fluctuation of the second output voltage V2r having exceeded a predetermined second level (5) An overcurrent failure indicative of a second current I2r flowing through the second switch 42a being higher than a predetermined second overcurrent threshold I2U The second lower voltage threshold V2L is for example set to a lower limit of a predetermined operation guarantee voltage range of each of the sensors 23a to 23c and the peripheral circuit 50c of the microcomputer 50, and the second overvoltage threshold V2U is for example set to an upper limit of the predetermined operation guarantee voltage range of each of the sensors 23a to 23c and the peripheral circuit 50c of the microcomputer 50.

The failures, which will be referred to as third power-supply failures, that may occur in the third power supply circuit 43 include (1) A zero-voltage failure indicative of the third output voltage V3r being zero (2) An excessive low voltage failure indicative of the third output voltage V3r being lower than a predetermined third lower voltage threshold V3L that is set to be higher than zero (3) An overvoltage failure indicative of the third output voltage V3r being higher than a predetermined third overvoltage threshold V3U that is set to be higher than zero (4) A voltage fluctuation failure indicative of the level of fluctuation of the third output voltage V3r having exceeded a predetermined second level (5) An overcurrent failure indicative of a third current I3r flowing through the third switch 43a being higher than a predetermined third overcurrent threshold I3U The third lower voltage threshold V3L is for example set to a lower limit of a predetermined operation guarantee voltage range of the CPU 50a of the microcomputer 50, and the third overvoltage threshold V3U is for example set to an upper limit of the predetermined operation guarantee voltage range of the CPU 50a of the microcomputer 50.

That is, the power supply monitor 62 monitors the first output voltage V1r and the first current I1r, the second output voltage V2r and the second current I2r, and the third output voltage V3r and the third current I3r to thereby determine whether at least one of the first power-supply failures in the first power supply circuit 41, the second power-supply failures in the second power supply circuit 42, and the third power-supply failures in the third power supply circuit 43 has occurred.

Then, the power supply monitor 62 sends, to the mode determiner 63, the results of the monitoring including whether at least one of the first power-supply failures in the first power supply circuit 41, the second power-supply failures in the second power supply circuit 42, and the third power-supply failures in the third power supply circuit 43 has occurred.

That is, the mode determiner 63 determines whether the power-supply circuit failure mode has occurred in the power supply controller 61 in accordance with the results of monitoring for the first to third power supply circuits 41 to 43 sent from the power supply monitor 62.

The switch-related failure mode represents at least one of the switch-related failures set forth above, and the mode determiner 63 determines whether the failure signal indicative of the occurrence of at least one of the switch-related failures is input thereto from the failure detector 92 via the second isolation transmitter 93.

The microcomputer/sensor-related failure mode represents at least one of the microcomputer-related failures set forth above, and the mode determiner 63 deter mines whether the second switch shutdown signal indicative of the occurrence of at least one of the microcomputer-related failures is input thereto from the microcomputer 50.

Upon determining that at least one of the controller failure mode, power-supply circuit failure mode, switch-related failure mode, and microcomputer-related failure mode has occurred in the control circuit 30 or its peripheral devices (YES in step S10), the mode determiner 63 outputs the first switch shutdown command to each of all the upper- and lower-arm controllers 71H and 71L in step S11. This causes each of all the upper-arm controllers 71H and the lower-arm controllers 71L to forcibly shut down the corresponding one of the high- and low-side switches 72H and 72L, resulting in all the upper- and lower-arm switches SWH and SWL being immediately turned off.

Otherwise, when it is determined that none of the controller failure mode, power-supply circuit failure mode, switch-related failure mode, and microcomputer-related failure mode has occurred in the control circuit 30 or its peripheral devices (NO in step S10), the failure mode determining routine proceeds to step S12.

In step S12, the mode determiner 63 enables the switch controller 70 to continuously control switching operations of the upper- and lower-arm switches SWH and SWL in accordance with the switching commands sent from the microcomputer 50 while disabling output of the first switch shutdown command. In step S12, the mode determiner 63 also enables the low-voltage power supply circuit 40 to continuously perform the above output voltage generation operations.

The reason why the mode determiner 63 outputs the first switch shutdown command to the switch controller 70 upon the affirmative determination in step S10 is as follows.

If it is determined that there is a failure in the low-voltage power supply circuit 40, the power monitor 62 can be configured to output a reset signal to the microcomputer 50 as a comparative example. That is, the occurrence of a failure in the low-voltage power supply circuit 40 can be included in the predetermined condition used by the power supply monitor 62.

The reset signal input to the microcomputer 50 enables the microcomputer 50 to be shut down, and thereafter the microcomputer 50 is initialized.

Unfortunately, it takes a short period until the microcomputer 50 has been completely shut down since the reset signal being input to the microcomputer 50. This may therefore result in the short period becoming an unguaranteed period for which normal operations of the control circuit 30 cannot be guaranteed. For example, during the unguaranteed period, the microcomputer 50 may carry out unexpected operations that could not expected during design of the control circuit 30.

That is, because the comparison example shuts down the microcomputer 50 to thereby indirectly turn off the upper- and lower-arm switches SWH and SWL in response to the occurrence of a failure in the low-voltage power supply circuit 40, normal operations of the control circuit 30 cannot be guaranteed.

From this viewpoint, the control circuit 30 according to the first embodiment is configured to cause the switch controller 70 to shut off the switching command sent from the microcomputer 50 and directly and forcibly shut down all the upper- and lower-arm switches SWH and SWL upon the affirmative determination in step S10.

This configuration therefore (1) Prevents the control circuit 30 from becoming an unguaranteed state during which normal operations of the microcomputer 50 are unguaranteed, enabling the inverter 20 to maintain higher reliability (2) Makes shorter the time for which the upper- and lower-switches SWH and SWL have been shut down since the occurrence of a failure in the low-voltage power supply circuit 40

In particular, the control circuit 30 according to the first embodiment is configured such that the power supply controller 61, the power monitor 62, the mode determiner 63, and the switch controller 70 are mounted to the same chip as the composite IC 60. This configuration makes further shorter the time for which the upper- and lower-switches SWH and SWL have been turned off since the occurrence of a failure in the low-voltage power supply circuit 40 or the power supply controller 61.

Figure 6:
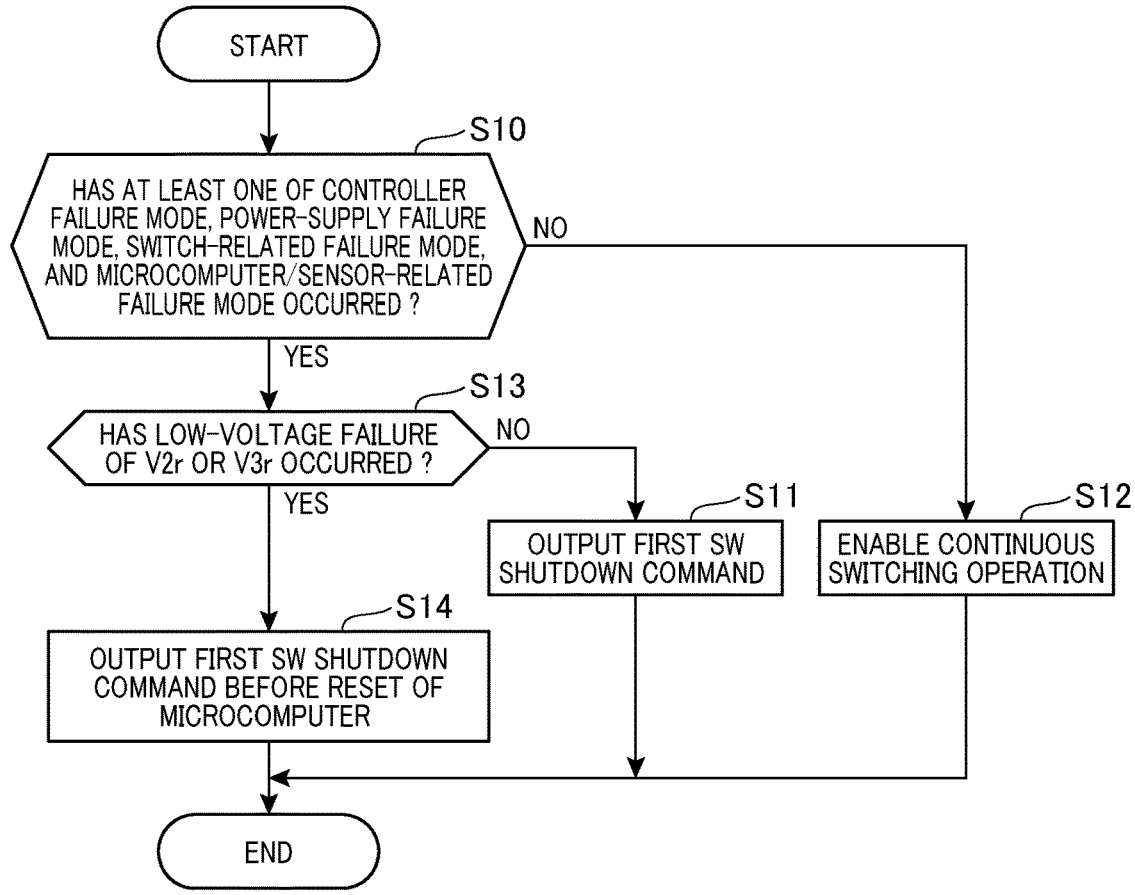
FIG. 6 is a flowchart schematically illustrating a modified mode determining routine according to a modification of the first embodiment.

Next, the following describes a modification of the first embodiment with a focus on the different points between this modification and the first embodiment with reference to FIG. 6. FIG. 6 schematically illustrates a modified mode deter mining routine according to this modification carried out by the mode determiner 63 for example every predetermined period. Like operations between the mode determining routines illustrated in respective FIGS. 5 and 6, to which like step numbers are assigned, are omitted or simplified to avoid redundant description.

Note that, in this modification, the occurrence of at least one of low-voltage failures described below in the low-voltage power supply circuit 40 is included in the predetermined condition used by the power supply monitor 62.

When it is determined that at least one of the controller failure mode, power-supply circuit failure mode, switch-related failure mode, and microcomputer-related failure mode has occurred in the control circuit 30 or its peripheral devices (YES in step S10), the modified mode determining routine proceeds to step S13.

In step S13, the mode determiner 63 determines whether the at least one of the controller failure mode, power-supply circuit failure mode, switch-related failure mode, and microcomputer-related failure mode includes at least one of low voltage failures of at least one of the second output voltage V2r and the third output voltage V3r.

Note that the low voltage failures of the second output voltage V2r include the zero-voltage failure indicative of the second output voltage V2r being zero, and the excessive low voltage failure indicative of the second output voltage V2r being lower than the predetermined second lower voltage threshold V2L. Similarly, the low voltage failures of the third output voltage V3r include the zero-voltage failure indicative of the third output voltage V3r being zero, and the excessive low voltage failure indicative of the third output voltage V3r being lower than the predetermined third lower voltage threshold V3L.

Upon determining that the at least one of the controller failure mode, power-supply circuit failure mode, switch-related failure mode, and microcomputer-related failure mode does not include the low voltage failures of at least one of the second output voltage V2r and the third output voltage V3r (NO in step S13), the mode determiner 63 performs the operation in step S11 set forth above.

Otherwise, when it is determined that the at least one of the controller failure mode, power-supply circuit failure mode, switch-related failure mode, and microcomputer-related failure mode includes at least one of the low voltage failures of at least one of the second output voltage V2r and the third output voltage V3r (YES in step S13), the modified mode determining routine proceeds to step S14. At that time, because the occurrence of at least one of the low-voltage failures described below in the low-voltage power supply circuit 40 is included in the predetermined condition used by the power supply monitor 62, the power supply monitor 62 sends the reset signal to the microcomputer 50.

In step S14, the mode determiner 63 outputs the first switch shutdown command to each of all the upper- and lower-arm controllers 71H and 71L to thereby forcibly shut down the corresponding one of the high- and low-side switches 72H and 72L before the microcomputer 50 is shut down in response to the reset signal being input thereto.

As described above, this modification of the first embodiment turns off each of all the high- and low-side switches 72H and 72L before the microcomputer 50 is shut down in response to the reset signal being input thereto. This therefore reliably prevents the control circuit 30 from becoming an unguaranteed state during which normal operations of the microcomputer 50 are unguaranteed even if the microcomputer 50 is configured to be reset in response to the input of the reset signal thereto.

Second Embodiment

Figure 7:
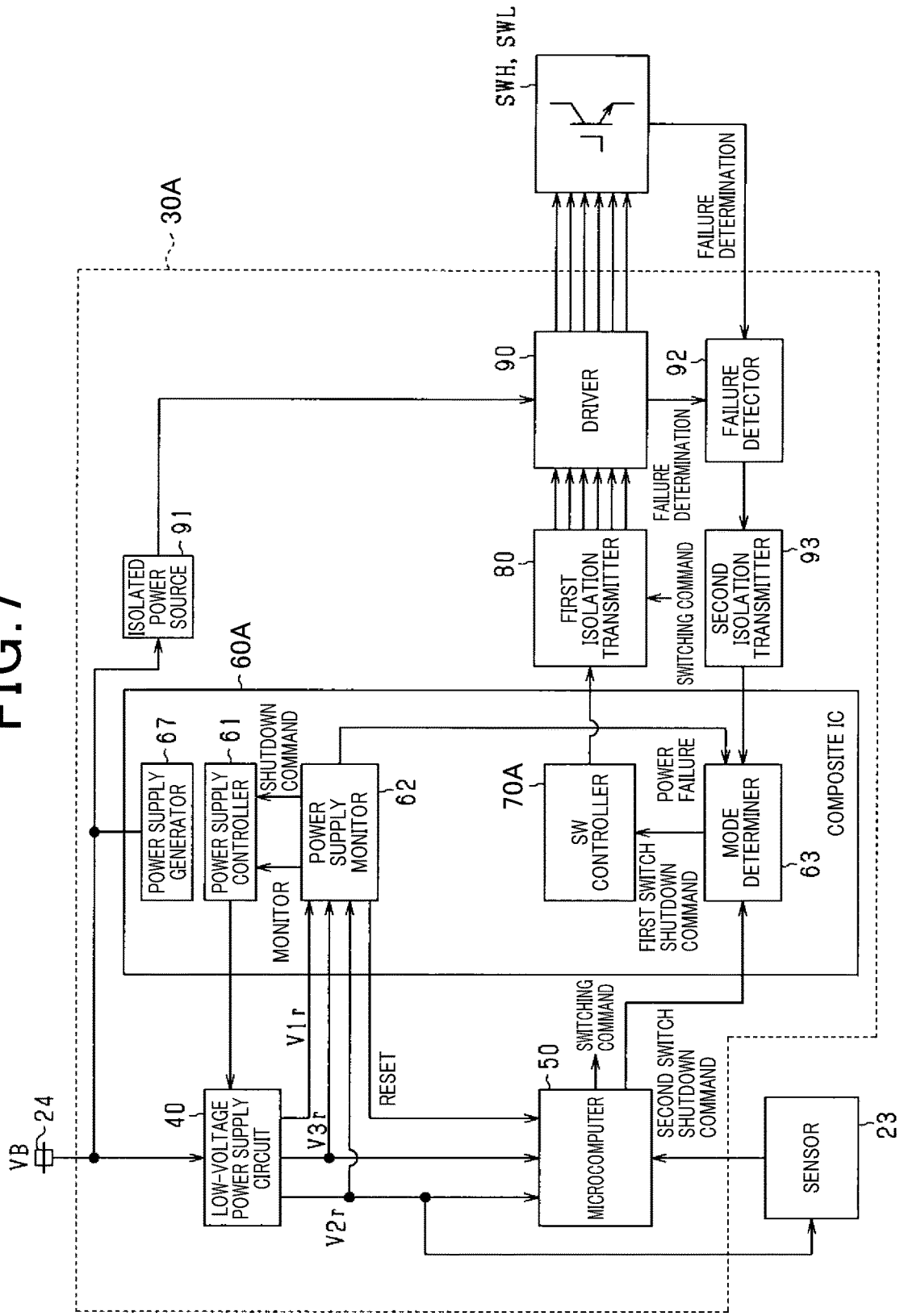
FIG. 7 is a block diagram schematically illustrating an example of the structure of a control circuit according to the second embodiment of the present disclosure.
Figure 8:
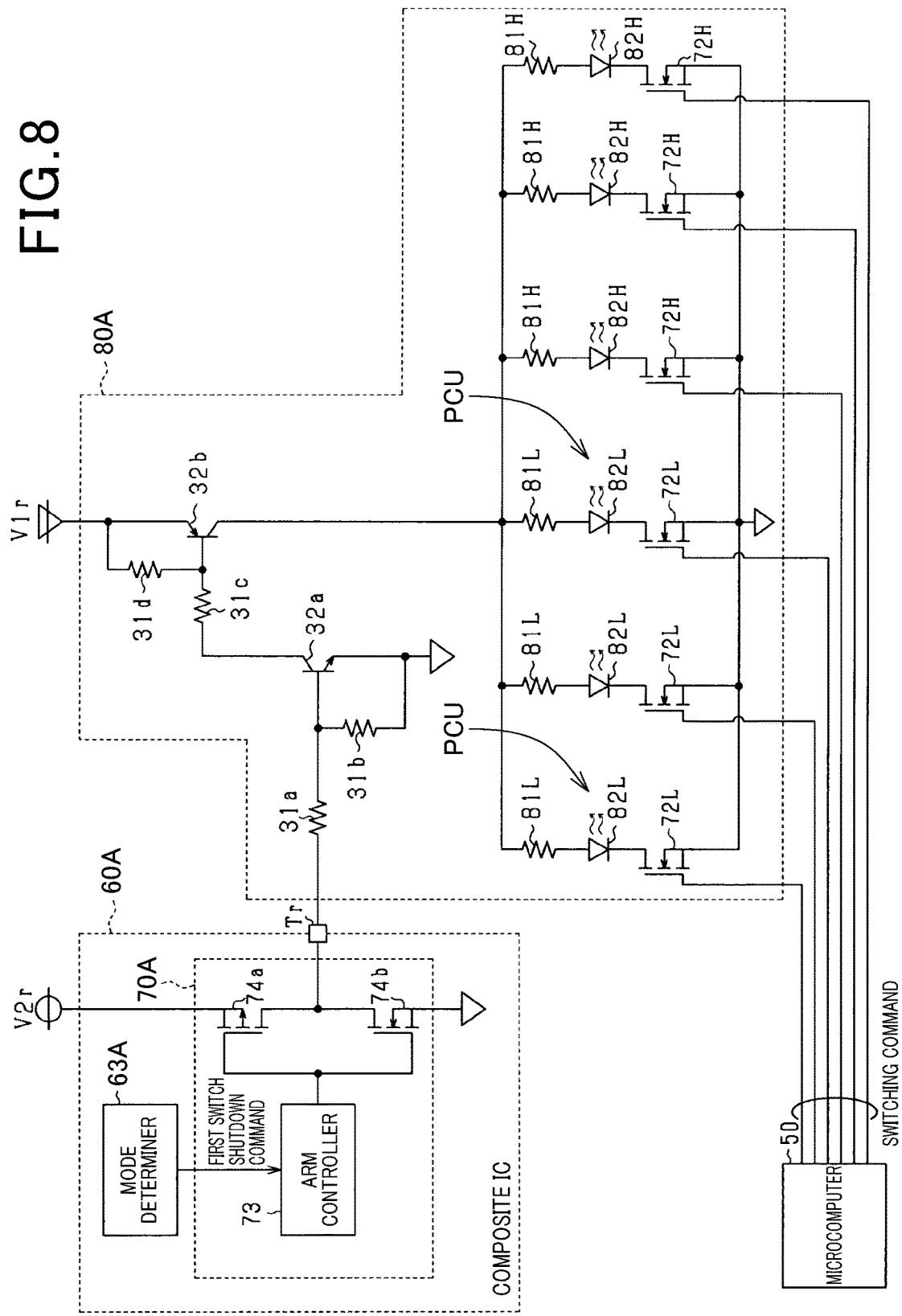
FIG. 8 is a circuit diagram schematically illustrating an example of the structure of each of a switch controller and a first isolation transmitter according to the second embodiment.
Figure 9:
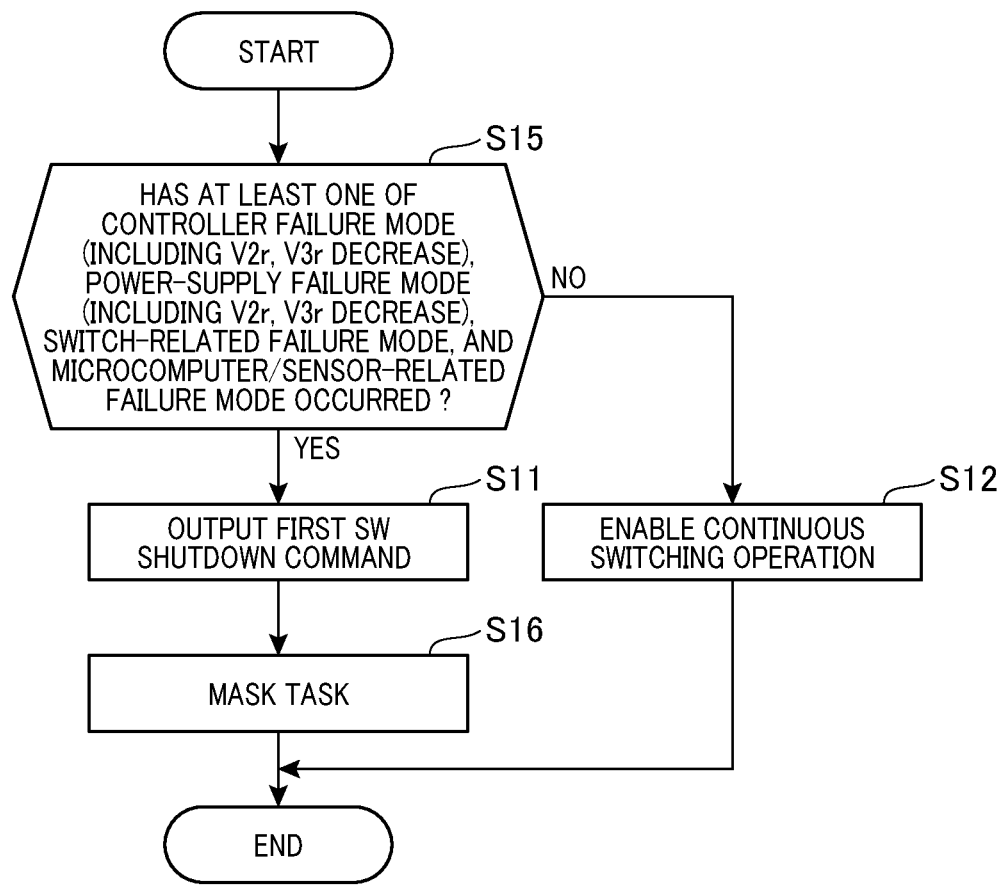
FIG. 9 is a flowchart schematically illustrating a mode determining routine according to the second embodiment.
Figure 10:
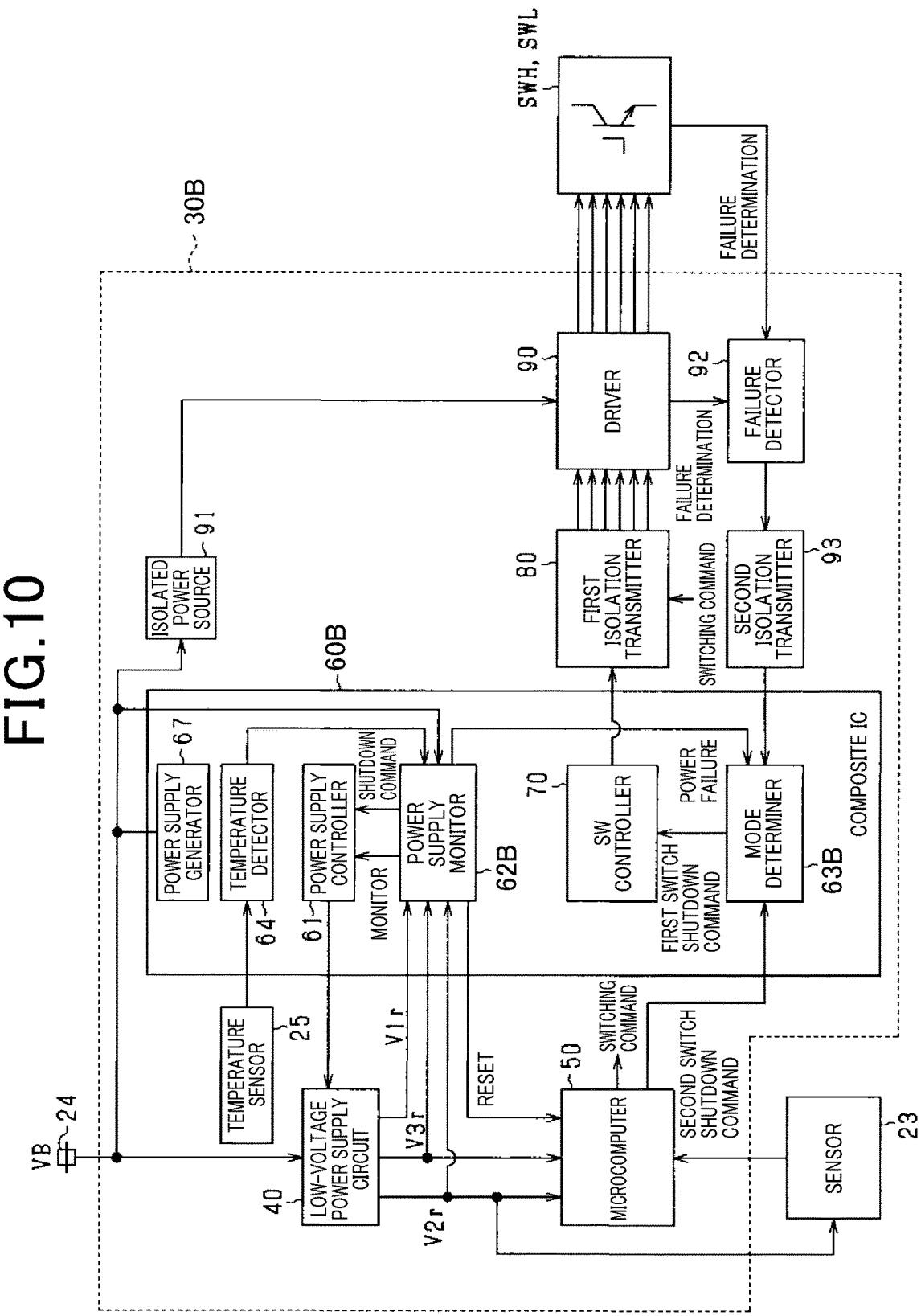
FIG. 10 is a block diagram schematically illustrating an example of the structure of a control circuit according to the third embodiment of the present disclosure.

The following describes a control circuit 30A according to the second embodiment of the present disclosure with reference to FIGS. 7 to 9. The structures and/or functions of the control circuit 30A according to the second embodiment are different from those of the control circuit 30 according to the first embodiment mainly by the following points. So, the following mainly describes the different points, and omits or simplifies descriptions of like parts between the first and second embodiments, to which identical or like reference characters are assigned, thus eliminating redundant descriptions.

The control circuit 30A according to the second embodiment includes a first isolation transmitter 80A and a composite IC 60A including a mode determiner 63A and a switch controller 70A. The composite IC 60A and the first isolation transmitter 80A are slightly different from the corresponding composite IC 60 and the first isolation transmitter 80 according to the first embodiment. The composite IC 60A is different from the composite IC 60 in the structure of the switch controller 70A as compared with the structure of the switch controller 70.

Referring to FIG. 8, the switch controller 70A includes an arm controller 73, a first base switch 74a, and a second base switch 74b. The second embodiment uses a P-channel MOSFET as the first base switch 74a, and also uses an N-channel MOSFET as the second base switch 74b. The first end of the second capacitor 42b of the second power supply circuit 42 is connected to a first main terminal, i.e. the source, of the first base switch 74a, and a second main terminal, i.e. the drain, of the first base switch 74a is connected to a first main terminal, i.e. the drain, of the second base switch 74b. A second main terminal, i.e. the source, of the second base switch 74b is connected to the common signal ground.

The first isolation transmitter 80A is comprised of first to fourth resistors 31a to 31d, a first control switch, such as an NPN transistor, 32a, and a second control switch, such as a PNP transistor, 32b. Each of the first to fourth resistors 31a to 31d has opposing first and second ends. The first end of the first resistor 31a is connected to the connection point between the second main terminal of the first base switch 74a and the first main terminal of the second base switch 74b via the terminal Tr of the composite IC 60A. A control terminal, such as the base, of the first control switch 32a and the first end of the second resistor 31b are commonly connected to the second end of the first resistor 31a. The first control switch 32a has opposing first and second main terminals. The second end of the second resistor 31b and the first main terminal, i.e. the emitter, of the first control switch 32a are commonly connected to the common signal ground.

The second control switch 32b has opposing first and second main terminals. The second main terminal, i.e. collector, of the first control switch 32a is connected to the first end of the third resistor 31c, and the second end of the third resistor 31c is connected to both a control terminal, i.e. the base, of the second control switch 32b, and the first end of the fourth resistor 31d. The second end of the fourth resistor 31d and the first main terminal, i.e. emitter, of the second control switch 32b is connected to the first end of the first capacitor 41d. The second main terminal, i.e. the collector, of the second control switch 32b is connected to the first end of each upper-arm resistor 81H and the first end of each lower-ram resistor 81L.

The second end of the upper-arm resistor 81H is connected to the anode of the photodiode 82H. The cathode of the photodiode 82H is connected to the first main terminal, i.e. the drain, of the corresponding high-side switch 72H, and the second main terminal, i.e. the source, of the low-side switch 72H is connected to the common signal ground, which is similar to the first embodiment.

The second end of the lower-arm resistor 81L is connected to the anode of the photodiode 82L. The cathode of the photodiode 82L is connected to the first main terminal, i.e. the drain, of the corresponding low-side switch 72L. A second main terminal, i.e. the source, of the low-side switch 72L is connected to the common signal ground, which is similar to the first embodiment.

That is, the upper-arm controllers 71H and the lower-arm controllers 71L are replaced with the arm controller 73 and the first and second base switches 74a and 74b.

The mode determiner 63A according to the second embodiment is configured to output the first switch shutdown command to the arm controller 73 upon determining that at least one of the controller failure mode, power-supply circuit failure mode, switch-related failure mode, and microcomputer-related failure mode has occurred in the control circuit 30 or its peripheral devices.

Otherwise, upon determining that none of the controller failure mode, power-supply circuit failure mode, switch-related failure mode, and microcomputer-related failure mode has occurred in the control circuit 30 or its peripheral devices (NO in step S10), the mode determiner 63A enables the switch controller 70 to continuously control switching operations of the upper- and lower-arm switches SWH and SWL in accordance with the switching commands sent from the microcomputer 50 while disabling output of the first switch shutdown command.

Upon determining that no first switch shutdown command is input to the arm controller 73 of the switch controller 70A, the arm controller 73 turns on the first base switch 74a or maintains the first base switch 74a in the on state while shutting down the second base switch 74b.

This enables the first and second control switches 32a and 32b to be turned on or maintained on, enabling the turn-on command or shutdown command to be output from each photocoupler PCU to the corresponding driver 90 based on the first output voltage V1r in the same manner as the first embodiment.

Otherwise, upon determining that the first switch shutdown command is input to the arm controller 73 of the switch controller 70A, the arm controller 73 turns off the first base switch 74a or maintains the first base switch 74a in the off state while turning on the second base switch 74b or maintains the second base switch 74b in the on state.

This causes the first and second control switches 32a and 32b to be turned off or maintained off, disabling each photodiode 82H, 82L from being energized based on the first output voltage V1r. This results in no switching command being input to each driver 90 via the first isolation transmitter 80A, resulting in each driver 90 forcibly shutting down the corresponding switch SWH, SWL in the same manner as the first embodiment.

The above combined configuration of the composite IC 60A and the first isolation transmitter 80A results in the number of signal lines between the composite IC 60A and the first isolation transmitter 80A being reduced down to only one signal line, which is lower than the number of signal lines between the composite IC 60 and the first isolation transmitter 80. This therefore results in the number of terminals Tr between the composite IC 60A and the first isolation transmitter 80A being reduced down to only one terminal, which is lower than the number of terminals Tr between the composite IC 60 and the first isolation transmitter 80.

Next, the following describes a mode deter mining routine according to the second embodiment carried out by the mode determiner 63A for example every predetermined period with reference to FIG. 9. Like operations between the mode determining routines illustrated in respective FIGS. 5 and 9, to which like step numbers are assigned, are omitted or simplified to avoid redundant description.

Upon starting the failure mode determining routine, the mode determiner 63A determines whether at least one of the controller failure mode, the power-supply circuit failure mode, the switch-related failure mode, and the microcomputer-related failure mode has occurred in the control circuit 30 or its peripheral devices including the sensors 23 in step S15.

The controller failure mode according to the second embodiment includes at least one of the internal power-source failure, the temperature failure, and the reference-voltage failure that may occur in the power supply controller 61. That is, the mode determiner 63 determines whether the controller failure mode has occurred in the power supply controller 61 in accordance with the results of monitoring for the power supply controller 61 sent from the power supply monitor 62.

The controller failure mode includes at least one of the internal power-source failure, temperature failure, and reference-voltage failure that may occur in the power supply controller 61.

The internal power-source failure according to the second embodiment represents a malfunction indicative of the output voltage of the internal power source being lower than a predetermined threshold voltage level. Note that the internal power source of the power supply controller 61 according to the second embodiment is configured to receive the second and third output voltages V2r and V3r, and convers, for example, a selected one of the second and third output voltages V2r and V3r to the predetermined voltage level on which the power supply controller 61 operates.

The temperature failure indicative of the temperature of the power supply circuit 61 having deviated from the predetermined allowable temperature range, and the reference-voltage failure indicative of the reference voltage used by the power supply controller 61 for control of each switch 41a, 42a, and 43a having deviated from the predetermined allowable voltage range.

The power-supply circuit failure mode includes at least one of the first power-supply failures in the first power supply circuit 41, the second power-supply failures in the second power supply circuit 42, and the third power-supply failures in the third power supply circuit 43. In particular, the overvoltage failure, which will be referred to as a V2r overvoltage failure, indicative of the second output voltage V2r being higher than the second overvoltage threshold V2U is eliminated from the second power-supply failures, and the overvoltage failure, which will be referred to as a V3r overvoltage failure, indicative of the third output voltage V3r being higher than the third overvoltage threshold V3U is eliminated from the third power-supply failures.

That is, the mode determiner 63A according to the second embodiment is specially configured not to output the first switch shutdown command to the arm controller 73 even if the V2r overvoltage failure or the V3r overvoltage failure has occurred as the power-supply circuit failure mode.

Additionally, the power-supply circuit failure mode includes the low voltage failures of the second output voltage V2r and the low voltage failures of the third output voltage V3r described in step S13 according to the first embodiment.

When it is determined that at least one of the controller failure mode, the power-supply circuit failure mode, the switch-related failure mode, and the microcomputer-related failure mode has occurred in the control circuit 30 or its peripheral devices including the sensors 23 (YES in step S15), the failure mode determining routine proceeds to step S11. The operation in step S11 has been described in the first embodiment.

Otherwise, when it is determined that none of the controller failure mode, power-supply circuit failure mode, switch-related failure mode, and microcomputer-related failure mode has occurred in the control circuit 30 or its peripheral devices (NO in step S15), the failure mode determining routine proceeds to step S12. The operation in step S12 has been described in the first embodiment.

The reason why the V2r overvoltage failure and the V3r overvoltage failure are eliminated from the power-supply circuit failure mode according to the second embodiment is as follows.

If the second and third output voltages V2r and V3r are lower than the respective second and third lower threshold voltages V2L and V3L, the microcomputer 50 may be shut down. On the other hand, if at least one of the second and third output voltages V2r and V3r supplied to the microcomputer 50 has exceeded the corresponding one of the second and third overvoltage thresholds V2U and V3U, the microcomputer 50 can continuously operate with an increase of its power consumption as long as at least one of the second and third output voltages V2r and V3r is equal to or lower than a predetermined absolute maximum rating voltage of the microcomputer 50.

From this viewpoint, the mode determiner 63A according to the second embodiment is configured not to output the first switch shutdown command to each of all the upper- and lower-arm controllers 71H and 71L in step S11 even if at least one of the V2r overvoltage failure and the V3r overvoltage failure has occurred. This configuration results in a reduction in limited control operations of the inverter 20 while enabling the inverter 20 to maintain higher reliability, making it possible to reduce periods during which the inverter 20 is uncontrolled due to the shutdowns of the microcomputer 50.

Additionally, the mode determiner 63A according to the second embodiment is configured to output the first switch shutdown command to each of all the upper- and lower-arm controllers 71H and 71L in step S11 upon determining that a failure has occurred in at least one of the second and third power supply circuits 42 and 43, which directly supply the second and third output voltages V2r and V3r to the microcomputer 50.

This configuration makes it possible to output, to the switch controller 70, the first switch shutdown command preferably as long as at least one of the second and third power supply circuits 42 and 43 has malfunctioned, i.e. as long as there is a malfunction, which may cause the microcomputer 50 to be shut down, in the control circuit 30A.

This configuration therefore results in a reduction in limited control operations of the inverter 20 while enabling the inverter 20 to maintain higher reliability, making it possible to reduce periods during which the inverter 20 is uncontrolled due to the shutdowns of the microcomputer 50.

Next, the following describes the first to fifth modifications of the second embodiment with a focus on the different points between each of the first to fifth modifications and the second embodiment.

Referring to FIG. 8, the first to fourth resistors 31a to 31d and the first and second switches 32a and 32b can be provided between the second main terminal, i.e. the source, of each switch 72H, 72L and the common signal ground as the first modification.

An N-channel MOSFET can be used for each of the first and second base switches 74a and 74b of the switch controller 70A as the second modification. A P-channel MOSFETs can be used for each of the first and second control switches 32a and 32b of the first isolation transmitter 80A as the second modification.

In FIG. 8, if the components 31a, 31b, 31c, 31d, 32a, 32b are collectively referred to as a voltage supply circuit, such two voltage supply circuit can be provided as first and second voltage supply circuits. At that time, the first voltage supply circuit and three sets of the components 72H, 81H, and 82H for the respective upper-arm switches SWH can be provided as the third modification. Similarly, the second voltage supply circuit and three sets of the components 72L, 81L, and 82L for the respective lower-arm switches SWL can be provided as the third modification. This enables a logical value of the switching command for the upper-arm switches SWH and a logical value of the switching command for the lower-arm switches SWL to be different from each other.

In step S11 of FIG. 9, the mode determiner 63A can be configured to deactivate the low-voltage power supply circuit 40 as the fourth modification. In this fourth modification, the mode determiner 63A can be configured to deactivate a selected one of the first to third power supply circuits 41 to 43 upon determining that a failure in the power-supply circuit failure mode has occurred in the selected one of the first to third power supply circuits 41 to 43 in step S15. Alternatively, the mode determiner 63A can be configured to deactivate all the first to third power supply circuits 41 to 43 upon determining that a failure in the power-supply circuit failure mode has occurred in one of the first to third power supply circuits 41 to 43 in step S15.

After deactivating at least one power supply circuit 41 to 43, the mode determiner 63A can be configured to execute a restart task of restarting the at least one deactivated power supply circuit in step S16 as the fifth modification (see FIG. 9). In the restarting task for the deactivated power supply circuit in step S16, the mode determiner 63A is preferably configured to execute a mask task of preventing the mode determiner 63A from determining that the low voltage failure has occurred in the power supply circuit to be restarted. Similarly, in the initial starting task for each of the first to third power supply circuits 41 to 43, the mode determiner 63A is preferably configured to execute the mask task of preventing the mode determiner 63A from determining that the low voltage failure has occurred in the corresponding one of the first to third power supply circuits 41 to 43.

Upon the affirmative determination in step S15 being carried out, the mode determiner 63A can be configured to execute the operations in steps S13, S14, S11, and S12 as illustrated in FIG. 6.

Third Embodiment

The following describes a control circuit 30B according to the third embodiment of the present disclosure with reference to FIGS. 10 to 13. The structures and/or functions of the control circuit 30B according to the third embodiment are different from those of the control circuit 30A according to the second embodiment mainly by the following points. So, the following mainly describes the different points, and omits or simplifies descriptions of like parts between the second and third embodiments, to which identical or like reference characters are assigned, thus eliminating redundant descriptions.

The control circuit 30B according to the third embodiment includes a temperature sensor 25 and a composite IC 60B including a temperature detector 64 and a power supply monitor 62B. The power supply monitor 62B has a function of monitoring the output voltage VB of the low-voltage DC power source 24.

The temperature sensor 25, which is comprised of, for example, a temperature-sensitive diode or a thermistor, is configured to output a temperature measurement signal indicative of the temperature or its correlation of the low-voltage power supply circuit 40 and indicative of the temperature or its correlation of the microcomputer 50.

For example, the temperature sensor 25 can be configured to output, as the temperature measurement signal, a temperature measurement signal indicative of the temperature or its correlation of (1) A component of the low-voltage power supply circuit 40

(2) The composite IC 60B (3) The atmosphere in the housing of the control circuit 30

The temperature detector 64 is configured to calculate, based on the temperature measurement signal sent from the temperature sensor 25, a first temperature measurement T1r for a first temperature detection target, and a second temperature measurement T2r for a second temperature detection target. For example, the temperature detector 64 is configured to calculate, based on the temperature measurement signal sent from the temperature sensor 25, (1) The first temperature measurement T1r indicative of the temperature or its correlation of a component, such as the second switch 42a, of the second power supply circuit 42

(2) The second temperature measurement T2r indicative of the temperature or its correlation of the microcomputer 50

Note that the temperature sensor 25 can be comprised of first and second temperature sensors 25, the first temperature sensor 25 can be configured to directly measure the temperature of the second switch 42a of the second power supply circuit 42, and the second temperature sensor 25 can be configured to directly measure the temperature of the microcomputer 50. Then, the temperature detector 64 can be configured to obtain (1) The first temperature measurement T1r based on the temperature measured by the first temperature sensor 25

(2) The second temperature measurement T2r based on the temperature measured by the second temperature sensor 25

The temperature detector 64 outputs the first and second temperature measurements T1r and T2r to the power supply monitor 62B.

Figure 11:
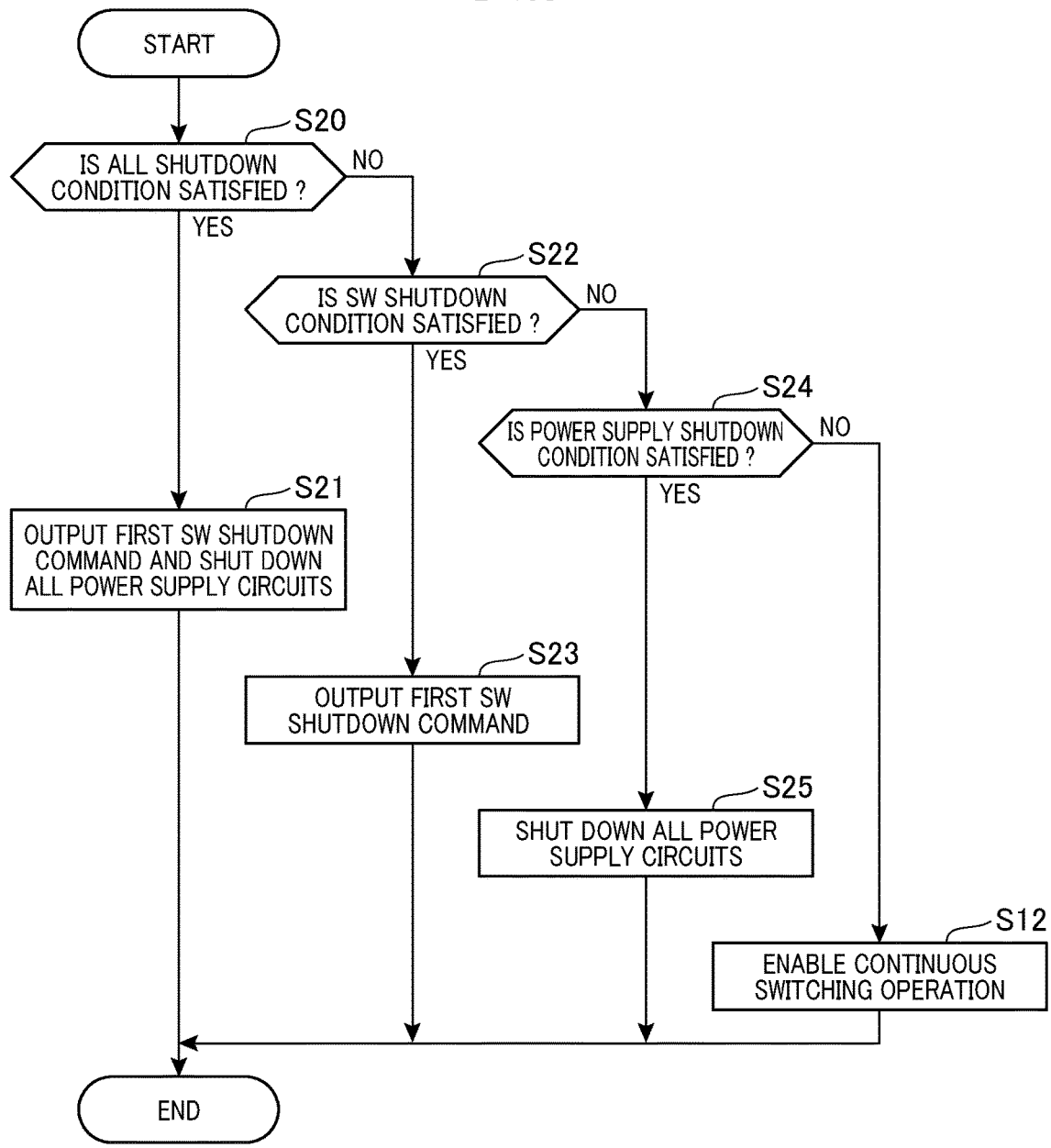
FIG. 11 is a flowchart schematically illustrating a mode determining routine according to the third embodiment.

Next, the following describes a failure mode determining routine carried out by the mode determiner 63B for example every predetermined period with reference to FIG. 11. Like operations between the mode determining routines illustrated in respective FIGS. 5 and 11, to which like step numbers are assigned, are omitted or simplified to avoid redundant description.

Upon starting the failure mode determining routine, the mode determiner 63B determines, based on the results of the monitoring sent from the power supply monitor 62B, whether an all shutdown condition is satisfied in step S20.

Upon determining that the all shutdown condition is satisfied (YES in step S20), the mode determiner 63B outputs the first switch shutdown command to the arm controller 73, and outputs, to the power supply controller 61 via the power supply monitor 62B, an instruction to shut down all the first to third power supply circuits 41 to 43. This causes the power supply controller 61 to shut down all the first to third switches 41a to 43a or maintain all the first to third switches 41a to 43a in the off state. This results in all the first to third power supply circuits 41 to 43 being shut down.

Note that the operation in step S21 according to the third embodiment corresponds to, for example, a power supply shutdown unit.

Next, the following describes the all shutdown condition with reference to FIG. 12. The fact that the all shutdown condition is satisfied means at least one of the following conditions (A1), (C1), (A2), (C2), (G2), (A3), (C3), and (G3) is satisfied.

The condition (A1) is that the first output voltage V1r is higher than the first overvoltage threshold V1U and the output voltage VB of the low-voltage DC power source 24 is higher than a predetermined input voltage threshold Vinb. The first overvoltage threshold V1U is set to be higher than the upper limit of the operation guarantee voltage range of the second power supply circuit 42 and to be equal to or lower than a predetermined absolute maximum rating voltage of the second power supply circuit 42. A situation where the condition (A1) is satisfied is that, for example, there is a possibility of the second switch 42a being overheated due to a short-circuit fault of the second switch 42a, so that the reliability of the low-voltage power supply circuit 40 is likely to decrease.

The condition (C1) is that the first output voltage V1r is higher than the first overvoltage threshold V1U and the first temperature measurement T1r is higher than a predetermined first temperature threshold Tth1 corresponding to an upper limit temperature. A situation where the condition (C1) is satisfied is that, for example, there is a possibility of the second switch 42a being overheated due to a short-circuit fault of the second switch 42a, so that the reliability of the low-voltage power supply circuit 40 is likely to decrease, which is similar to the condition (A1).

The condition (A2) is that the second output voltage V2r is higher than the second overvoltage threshold V2U and the first output voltage V1r is higher than a predetermined first input voltage threshold Vin1. The second overvoltage threshold V2U is set to be higher than the upper limit of the operation guarantee voltage range of the microcomputer 50 and to be equal to or lower than a predetermined absolute maximum rating voltage of the peripheral circuit 50c of the microcomputer 50. A situation where the condition (A2) is satisfied is that, for example, there is a possibility of the microcomputer 50 being overheated, so that the reliability of the microcomputer 50 is likely to decrease.

The condition (C2) is that the second output voltage V2r is higher than the second overvoltage threshold V2U and the second temperature measurement T2r is higher than a predetermined second temperature threshold Tth2. A situation where the condition (C2) is satisfied is that, for example, there is a possibility of the microcomputer 50 being overheated, so that the reliability of the microcomputer 50 is likely to decrease, which is similar to the condition (A2).

The condition (G2) is that the second output voltage V2r is lower than the second lower voltage threshold V2L. A situation where the condition (G2) is satisfied is that, for example, there is a possibility of the microcomputer 50 being shut down.

The condition (A3) is that the third output voltage V3r is higher than the third overvoltage threshold V3U and the second output voltage V2r is higher than a predetermined second input voltage threshold Vin2. The third overvoltage threshold V3U is set to be higher than the upper limit of the operation guarantee voltage range of the microcomputer 50 and to be equal to or lower than the absolute maximum rating voltage of the microcomputer 50. A situation where the condition (A3) is satisfied is that, for example, there is a possibility of the microcomputer 50 being overheated, so that the reliability of the microcomputer 50 is likely to decrease.

The condition (C3) is that the third output voltage V3r is higher than the third overvoltage threshold V3U and the second temperature measurement T2r is higher than the second temperature threshold Tth2. A situation where the condition (C3) is satisfied is that, for example, there is a possibility of the microcomputer 50 being overheated, so that the reliability of the microcomputer 50 is likely to decrease, which is similar to the condition (A3).

The condition (G3) is that the third output voltage V3r is lower than the third lower voltage threshold V3L. A situation where the condition (G3) is satisfied is that, for example, there is a possibility of the microcomputer 50 being shut down.

Otherwise, upon determining that the all shutdown condition is not satisfied (NO in step S20), the mode determiner 63B determines whether a switch shutdown condition is satisfied in step S22. Upon determining that the failure signal is input thereto from the failure detector 92 or the second switch shutdown command is input thereto from the microcomputer 50, the mode determiner 63B determines that the switch shutdown condition is satisfied (YES in step S22). Then, the mode determiner 63B outputs the first switch shutdown command to the arm controller 73 without outputting, to the power supply controller 61 via the power supply monitor 62B, the instruction to shut down all the first to third power supply circuits 41 to 43.

Otherwise, upon determining that neither the failure signal is input thereto from the failure detector 92 nor the second switch shutdown command is input thereto from the microcomputer 50, the mode determiner 63B determines that the switch shutdown condition is not satisfied (NO in step S22).

Then, the mode determiner 63B determines whether a power supply shutdown condition is satisfied in step S24.

Upon determining that the power supply shutdown condition is satisfied (YES in step S24), the mode determiner 63B outputs, to the power supply controller 61 via the power supply monitor 62B, the instruction to shut down all the first to third power supply circuits 41 to 43 without outputting the first switch shutdown command to the arm controller 73. This causes the power supply controller 61 to shut down all the first to third switches 41a to 43a or maintain all the first to third switches 41a to 43a in the off state. This results in all the first to third power supply circuits 41 to 43 being shut down.

Next, the following describes the power supply shutdown condition with reference to FIG. 12. The fact that the power supply shutdown condition is satisfied means at least one of the following conditions (F1), (F2), and (F3) is satisfied.

The condition (F1) is that the first current I1r is higher than the first overcurrent threshold I1U.

The condition (F2) is that the second current I2r is higher than the second overcurrent threshold I2U.

The condition (F3) is that the third current I3r is higher than the third overcurrent threshold I3U.

Otherwise, when it is determined that the power supply shutdown condition is not satisfied (NO in step S24), the failure mode determining routine proceeds to step S12. The operation in step S12 has been described in the first embodiment.

A situation where the determination in step S24 is negative is that any one of the following conditions (B1), (D1), (B2), (D2), (B3), and (D3) is satisfied.

The condition (B1) is that the first output voltage V1r is higher than the first overvoltage threshold V1U and the output voltage VB of the low-voltage DC power source 24 is equal to or lower than the input voltage threshold Vinb.

The condition (D1) is that the first output voltage V1r is higher than the first overvoltage threshold V1U and the first temperature measurement T1r is equal to or lower than the first temperature threshold Tth1. A situation where the condition (B1) or (D1) is satisfied is that the second switch 42a is not overheated, so that continuous operation of the low-voltage power supply circuit 40 is enabled while the reliability of the low-voltage power supply circuit 40 is maintained.

The condition (B2) is that the second output voltage V2r is higher than the second overvoltage threshold V2U and the first output voltage V1r is equal to or lower than the first input voltage threshold Vin1.

The condition (D2) is that the second output voltage V2r is higher than the second overvoltage threshold V2U and the second temperature measurement T2r is equal to or lower than the second temperature threshold Tth2.

The condition (B3) is that the third output voltage V3r is higher than the third overvoltage threshold V3U and the second output voltage V2r is equal to or lower than the second input voltage threshold Vin2.

The condition (D3) is that the third output voltage V3r is higher than the third overvoltage threshold V3U and the second temperature measurement T2r is equal to or lower than the second temperature threshold Tth2. A situation where the condition (B2), (D2), (B3), or (D3) is satisfied is that the microcomputer 50 is not overheated, so that continuous operation of the low-voltage power supply circuit 40 is enabled while the reliability of the microcomputer 50 is maintained.

As described above, the mode determiner 63B of the control circuit 30B according to the third embodiment is configured not to output the first switch shutdown command to the arm controller 73 upon determining that any one of the above conditions (B1), (D1), (B2), (D2), (B3), and (D3). This configuration therefore results in an increase of the opportunities for controlling the inverter 20 while enabling the inverter 20 to maintain higher reliability.

Additionally, the mode determiner 63B of the control circuit 30B according to the third embodiment is configured to shut down all the first to third power supply circuits 41 to 43 in step S21 or step S25 of FIG. 11.

In the microcomputer 50, if the magnitude relationship between the power supply voltage for the CPU 50a, such as the third output voltage V3r, and the power supply voltage for the peripheral circuit 50c, such as the second output voltage V2r, were reversed, the reliability of the microcomputer 50 would be reduced. For example, if the third power supply circuit 43 were continuously operated while the second power supply circuit 42 were shut down, the power supply voltage for the CPU 50a would become higher than the power supply voltage for the peripheral circuit 50c. This would result in the magnitude relationship between the power supply voltage for the CPU 50a and the power supply voltage for the peripheral circuit 50c being reversed.

Specifically, an overvoltage prevention diode may be provided in the microcomputer 50 between a power supply unit based on the second output voltage V2r of the second power supply circuit 42 for the peripheral circuit 50c and a power supply circuit based on the third output voltage V3r of the third power supply circuit 43 for the CPU 50a.

At that time, if the third power supply circuit 43 were continuously operated while the second power supply circuit 42 were shut down, a large amount of current would flow through the overvoltage protection diode, which would result in a malfunction in the microcomputer 50.

From this viewpoint, the mode determiner 63B of the control circuit 30B according to the third embodiment is configured to shut down all the first to third power supply circuits 41 to 43 set forth above, and thereafter restart all the first to third power supply circuits 41 to 43. This configuration prevents the magnitude relationship between the power supply voltage for the CPU 50a, such as the third output voltage V3r, and the power supply voltage for the peripheral circuit 50c, such as the second output voltage V2r, from being reversed. Deactivating all the first to third power supply circuits 41 to 43 enables restarting of all the deactivated first to third power supply circuits 41 to 43 to be safely carried out in the same manner as the initial starting of the first to third power supply circuits 41 to 43.

Next, the following describes the first to fourth modifications of the third embodiment with a focus on the different points between each of the first to fourth modifications and the third embodiment.

Upon determining that the first output voltage V1r is higher than the first overvoltage threshold V1U, the mode determiner 63B according to the first modification can selectively execute one of the operation in step S21 and the operation in step S12 in accordance with the following condition (E1) in place of the conditions (A1) to (D1) in FIG. 12.

Figure 13:
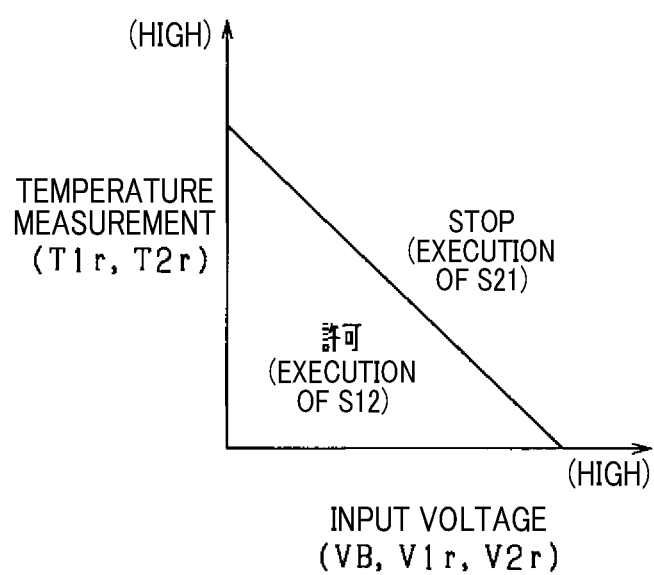
FIG. 13 is a graph schematically illustrating a modification of the mode determining routine according to the third embodiment.

Specifically, as illustrated in FIG. 13, the condition (E1) is that, the higher the output voltage VB of the low-voltage DC power source 24 as an input voltage to the first power supply circuit 41 is, the lower the first temperature threshold Tth1 to be compared with the first temperature measurement T1r is.

Similarly, upon determining that the second output voltage V2r is higher than the second overvoltage threshold V2U, the mode determiner 63B according to the first modification can selectively execute one of the operation in step S21 and the operation in step S12 in accordance with the following condition (E2) in place of the conditions (A2) to (D2) in FIG. 12.

Specifically, as illustrated in FIG. 13, the condition (E2) is that, the higher the first output voltage V1 as an input voltage to the second power supply circuit 42 is, the lower the second temperature threshold Tth2 to be compared with the second temperature measurement T2r is.

Additionally, upon determining that the third output voltage V3r is higher than the third overvoltage threshold V3U, the mode determiner 63B according to the first modification can selectively execute one of the operation in step S21 and the operation in step S12 in accordance with the following condition (E3) in place of the conditions (A3) to (D3) in FIG. 12.

Specifically, as illustrated in FIG. 13, the condition (E3) is that, the higher the second output voltage V2 as an input voltage to the third power supply circuit 43 is, the lower the second temperature threshold Tth2 to be compared with the second temperature measurement T2r is.

In step S21 or S25, the mode determiner 63B according to the second modification can be configured to deactivate a selected one of the first to third power supply circuits 41 to 43 upon determining that a failure has occurred in the selected one of the first to third power supply circuits 41 to 43 (see FIG. 12). For example, in step S20, if the condition (A1) is satisfied, the mode determiner 63B can be configured to shut down the first power supply circuit 41 in which a failure has occurred.

This enables the deactivated power supply circuit and a device to which the power supply voltage of the deactivated power supply circuit is supplied to be protected.

Upon the affirmative determination in step S20 being carried out, the mode determiner 63B according to the third modification can be configured to execute the operations in steps S13, S14, S11, and S12 as illustrated in FIG. 6.

The control circuit 30B according to the third embodiment is configured based on the structure of the control circuit 30A according to the second embodiment illustrated in FIG. 7, but the control circuit 30B according to the fourth modification can be configured based on the structure of the control circuit 30 according to the first embodiment illustrated in FIG. 2.

Fourth Embodiment

Figure 14:
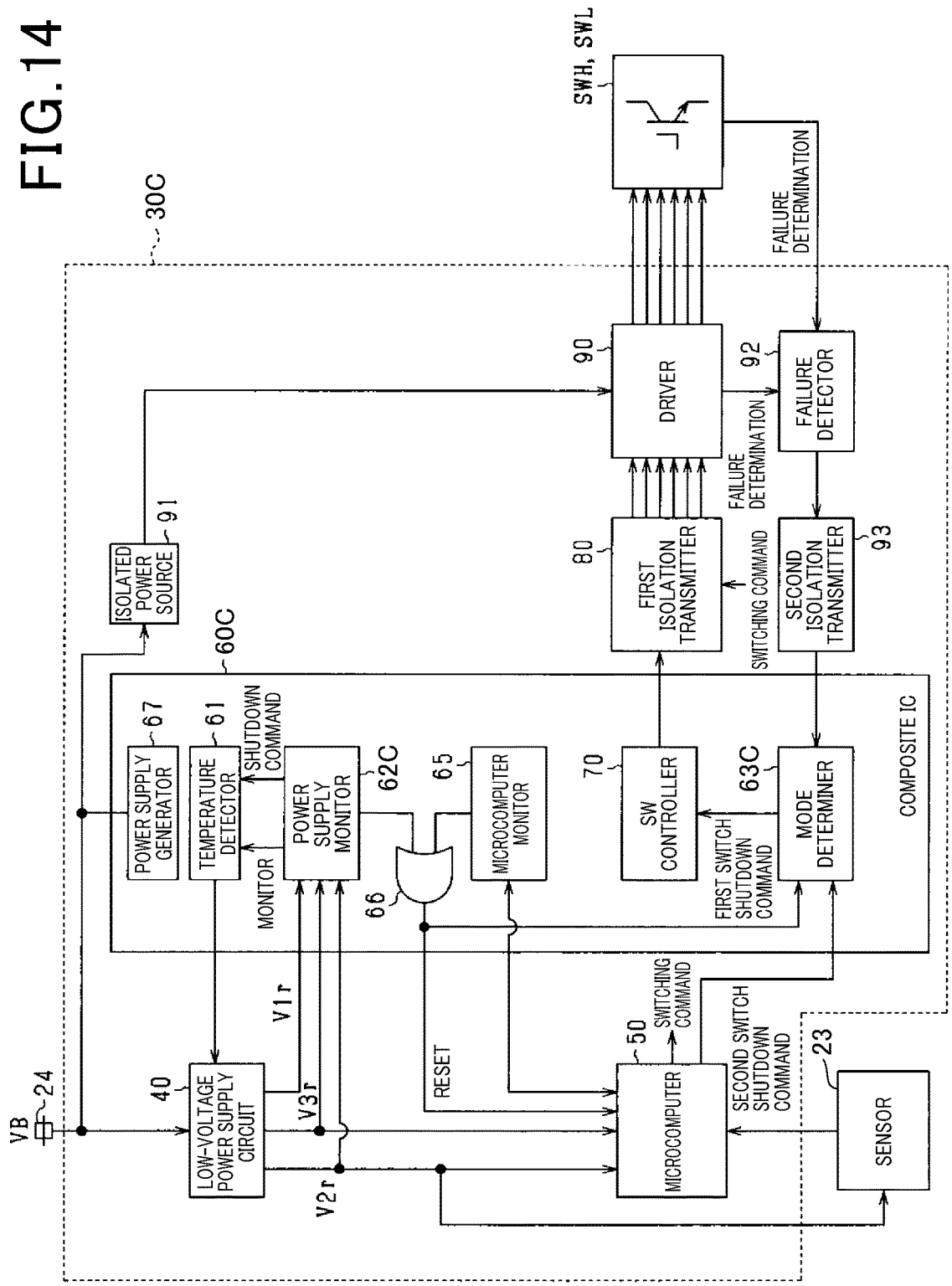
FIG. 14 is a block diagram schematically illustrating an example of the structure of a control circuit according to the fourth embodiment of the present disclosure.

The following describes a control circuit 30C according to the fourth embodiment of the present disclosure with reference to FIG. 14. The structures and/or functions of the control circuit 30C according to the fourth embodiment are different from those of the control circuit 30A according to the second embodiment mainly by the following points. So, the following mainly describes the different points, and omits or simplifies descriptions of like parts between the second and fourth embodiments, to which identical or like reference characters are assigned, thus eliminating redundant descriptions.

The control circuit 30C according to the fourth embodiment includes a composite IC 60B including a power supply monitor 62C, a microcomputer monitor 65, and an OR circuit 66.

The microcomputer monitor 65 is operative to determine whether an operation failure, i.e. a malfunction, has occurred in the microcomputer 50 using, for example, a known watchdog timer method. Upon determining that a failure has occurred in the microcomputer 50, the microcomputer monitor 65 outputs, to the OR circuit 66, a logical high level signal.

The power supply monitor 62C is configured to output a logical high level signal to the OR circuit 66 upon determining that one of the controller failure mode and the power-supply circuit failure mode has occurred.

The OR circuit 66 is configured to (1) Output a logical low level signal to the microcomputer 50 upon no logical high level signals being input thereto from the power supply monitor 62C and the microcomputer monitor 62C (2) Output a logical high level signal to the microcomputer 50 upon the logical high level signal being input thereto from at least one of the power supply monitor 62C and the microcomputer monitor 62C Upon determining that the output of the OR circuit 66 is switched from the logical low level to the logical high level, the microcomputer 50 determines that a reset signal is input thereto, so that the microcomputer 50 is shut down, resulting in the microcomputer 50 being initialized.

Additionally, upon determining that the output of the OR circuit 66 is switched from the logical low level to the logical high level, the mode determiner 63C is configured to output the first switch shutdown command to the arm controller 73 of the switch controller 70.

The control circuit 30C according to the fourth embodiment is configured to forcibly shut down all the upper- and lower-arm switches SWH and SWL upon determining that a failure has occurred in the microcomputer 50 in place of the low-voltage power supply circuit 40 or the power supply controller 61.

The control circuit 30C according to the fourth embodiment is configured based on the structure of the control circuit 30A according to the second embodiment illustrated in FIG. 7, but the control circuit 30C according to the fourth embodiment can be configured based on the structure of the control circuit 30 according to the first embodiment illustrated in FIG. 2.

Modifications

The above embodiments can be modified as described below.

The structure of the control circuit 30C for forcibly shutting down all the upper- and lower-arm switches SWH and SWL upon determining that a failure has occurred in the microcomputer 50 according to the fourth embodiment can be applied to each of the first to third embodiments.

The structure of the low-voltage power supply circuit 40 is not limited to the structure illustrated in FIG. 3. For example, the third power supply circuit 43 can be designed as a series regulator like the second power supply circuit 42, and the low-voltage power supply circuit 40 can include another power supply circuit added to the first to third power supply circuits 41 to 43. Each of the first to third power supply circuits 41 to 43 can be provided in plurality.

The first output voltage V1r can be directly input to the composite IC 60 without being resistively divided. Similarly, the second and third output voltages V2r and V3r can be directly input to the composite IC 60 without being resistively divided.

At least part of the components constituting each of the first to third power supply circuits 41 to 43 can be provided in the composite IC 60, 60A, 60B, or 60C.

Figure 15A:
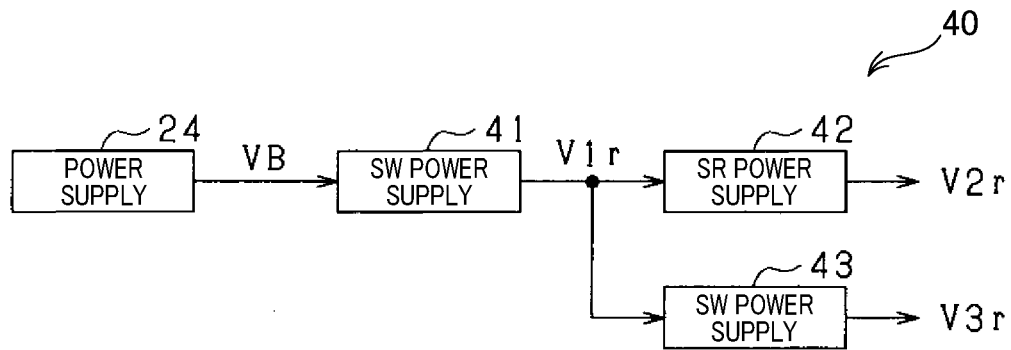
FIG. 15A is a block diagram schematically illustrating the circuit structure of the low-voltage power supply circuit illustrated in FIG. 3.

FIG. 15A schematically illustrates the circuit structure of the low-voltage power supply circuit 40 illustrated in FIG.

3, but the present disclosure is not limited thereto. Specifically, the low-voltage power supply circuit 40 can have a modified structure illustrated in FIG. 15B.

Figure 15B:
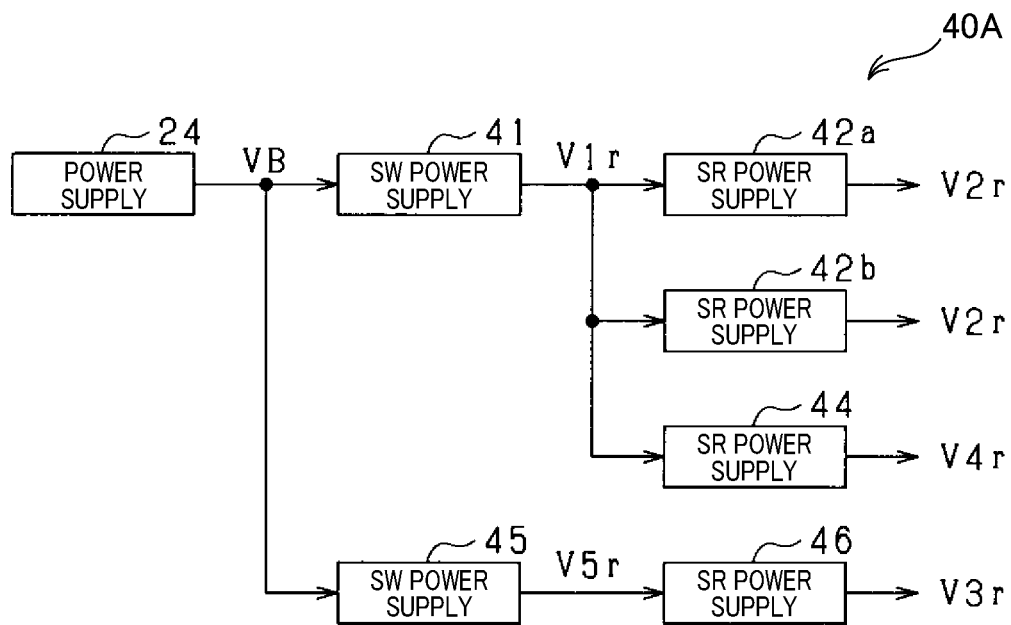
FIG. 15B is a block diagram schematically illustrating the circuit structure of a modified low-voltage power supply circuit according to the present disclosure.

Referring to FIG. 15B, a modified low-voltage power supply circuit 40A includes a 2A-th power supply circuit 42a, a 2B-th power supply circuit 42b, a fourth power supply circuit 44, a fifth power supply circuit 45, and a sixth power supply circuit 46.

Each of the 2A-th and 2B-th power supply circuits 42a and 42b, each of which is designed as, for example, a series regulator, is configured to step down the first output voltage V1r, thus outputting a stepped down voltage to the microcomputer 50 as the second output voltage V2r. The second output voltage V2r generated by the 2A-th power supply circuit 42a is supplied to, for example, some of the peripheral circuit 50c of the microcomputer 50, and the second output voltage V2r generated by the 2B-th power supply circuit 42b is supplied to, for example, each of the sensors 23a to 23c.

The fourth power supply circuit 44, which is designed as, for example, a series regulator, is configured to step down the first output voltage V1r, thus outputting a stepped down voltage to the microcomputer 50 as a fourth output voltage V4r. The fourth output voltage V4r generated by the 2A-th power supply circuit 42a is supplied to, for example, some of the peripheral circuit 50c of the microcomputer 50.

The fifth power supply circuit 45, which is designed as, for example, a series regulator, is configured to step down the output voltage VB of the low-voltage DC power source 24, thus outputting a stepped down voltage to a third power supply circuit 46, which is designed as, for example, a series regulator, as a fifth output voltage V5r. The third power supply circuit 46 is configured to output the third output voltage V3r set forth above. Note that the magnitude relationship among the output voltages V3r, V5r, V4r, and V2r have the following equation:

$$V3r < V5r < V4r < V2r$$

Each of the above embodiments is configured such that each of the second and third power supply circuits 42 and 43 supplies a corresponding power supply voltage to the microcomputer 50, but a single power supply circuit can supply a power supply voltage to the microcomputer 50.

In each of the above embodiments, a dedicated power supply circuit can be provided for each of the sensors 23a to 23c. In this modification, the mode determiner 63 can be configured to selectively execute a first task of outputting the first switch shutdown command and a second task of preventing output of the first switch shutdown command upon deterring that a failure has occurred in the dedicated power supply circuit for at least one of the sensors 23a to 23c.

Each of the mode determiners 63 and 63A to 63c according to the first to fourth embodiments is configured to output the first switch shutdown command to the switch controller 70 to thereby cause the switch controller 70 to output the shutdown command to each of the upper- and lower-arm switches SWH and SWL, but the present disclosure is not limited thereto.

Specifically, upon determining that a failure has occurred in the low-voltage power supply circuit 40, the power supply monitor 62 can serve as a circuit determiner to output the first switch shutdown signal to the switch controller 70. That is, the power supply monitor 62 can serve as the mode determiner 63. In this modification, the mode determiner 63 can be eliminated from the control circuit 30.

As the microcomputer 50, which serves as, for example, a command generator, a microcomputer operating on a single power supply of, for example, 5 V or 3.3 V can be used. A control IC or a custom IC having a specific function of controlling a power converter can be used as the microcomputer 50.

The power supply controller 61, the power supply monitor 62, the mode determiner 63, and the switch controller 71 can be mounted to an IC whose type is different from a composite IC.

The sensors 23a to 23c can be installed in the control circuit 30.

Each embodiment uses optical isolation devices, such as photocouplers, for the first isolation transmitter 80 and the second isolation transmitter 93, but can use magnetic isolation devices, such as magnetic couplers for the first isolation transmitter 80 and the second isolation transmitter 93.

The controlled variable of the rotary electric machine 10 is not limited to torque of the rotary electric machine 10. The rotational speed of the rotor of the rotary electric machine 10 or another parameter can be used as the controlled variable of the rotary electric machine 10.

The rotary electric machine 10 is not limited to a permanent magnet synchronous rotary electric machine, but can be designed as, for example, a wound-field synchronous rotary electric machine or an induction rotary electric machine. In addition, the rotary electric machine 10 is not limited to the one used as a main engine to generate running power of a vehicle. The rotary electric machine 10 can be used as an assist motor of electrical power steering systems or as a motor constituting an electric compressor for air conditioning.

Each upper- and lower-arm switch can be comprised of plural switches parallely connected to each other. For example, an IGBT and a MOSFET can be used as the parallely connected plural switches for each upper- and lower-arm switch.

The rotary electric machine 10 is not limited to a three phase rotary electric machine, but can be designed as a multiphase rotary electric machine, such as a six phase rotary electric machine or a nine phase rotary electric machine. For example, if a six phase rotary electric machine is used, an inverter comprised of six upper-arm switches and six lower-arm switches connected to the respective upper-arm switches can be used.

A boost converter can be provided between the high voltage battery 21 and the inverter 20.

Resistors and/or switches constituting the low-voltage power supply circuit 40 can be mounted to the composite IC 60.

The low-voltage power supply circuit 40 is not limited to a stepdown converter circuit. Specifically, a boost converter circuit or a buck-boost converter circuit can be used as the low-voltage power supply circuit 40.

Plural sets of rotary electric machines and inverters, such as two or three sets of rotary electric machines and inverters, can be provided in the control system 100. If two sets of three-phase rotary electric machines and inverters are provided in the control system 100, each inverter should be comprised of six upper- and lower-arm switches.

A DC to DC converter having at least one of a voltage boosting function and a voltage stepdown function or an alternating-current (AC) to AC converter, i.e. a matrix converter, for converting an AC voltage input thereto to a predetermined AC voltage can be used as a power converter according to the present disclosure.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A control circuit for controlling a power converter that includes a switch, the control circuit comprising:
a power supply circuit configured to output electrical power;
a command generator configured to generate a switching command that controls switching operations of the switch, based on the electrical power output from the power supply circuit;
a failure mode deter miner configured to:
perform a determination of whether which of failure modes has occurred in the power supply circuit; and
output a result of the determination; and
a switch controller configured to selectively execute, based on the result of the determination, a first switch control task and a second switch control task,
the first switch control task forcibly shutting down the switch independently of the switching command,
the second switch control task enabling the switching operations of the switch to be continuously controlled based on the switching command.

2. The control circuit according to claim 1, wherein:
the power supply circuit is configured to generate, as the electrical power, an output voltage to the command generator;
the failure mode determiner is configured to:
measure the output voltage of the power supply circuit; and
determine whether a low voltage failure as one of the failure modes has occurred in the power supply circuit, the low voltage failure representing a failure where the measured output voltage is lower than a lower limit of a predetermined operation guarantee voltage range of the power supply circuit; and
the switch controller is configured to select the first switch control task to forcibly shut down the switch upon it being determined that the low voltage failure has occurred in the power supply circuit.

3. The control circuit according to claim 2, wherein:
the failure mode determiner is configured to output a reset signal to the command generator to thereby shut down the command generator upon determining that the low voltage failure has occurred in the power supply circuit; and
the switch controller is configured to select the first switch control task to forcibly shut down the switch before shutdown of the command generator in response to an input of the reset signal to the command generator.

4. The control circuit according to claim 2, wherein:
the power supply circuit is configured to generate, as the electrical power, an output voltage to the command generator based on an input voltage thereto;
the failure mode determiner is configured to:
measure the input voltage to the power supply circuit;
determine whether the measured input voltage is higher than a predetermined input voltage threshold; and
determine whether an overvoltage failure as one of the failure modes has occurred in the power supply circuit, the overvoltage failure representing a failure where the measured output voltage is higher than an upper limit of the predetermined operation guarantee voltage range of the power supply circuit; and
the switch controller is configured to:
select the first switch control task to forcibly shut down the switch upon it being determined that the overvoltage failure has occurred and that the measured input voltage is higher than the input voltage threshold; and
select the second switch control task to enable the switching operations of the switch to be continuously controlled upon it being determined that the overvoltage failure has occurred and that the measured input voltage is equal to or lower than the input voltage threshold.

5. The control circuit according to claim 2, wherein:
the failure mode determiner is configured to:
measure a value of at least one of a first temperature parameter correlating with a temperature of the command generator and a second temperature parameter correlating with a temperature of the power supply circuit;
determine whether the measured value of the at least one of the first and second temperature parameters is higher than a predetermined upper limit for the at least one of the first and second temperature parameters; and
determine whether an overvoltage failure as one of the failure modes has occurred in the power supply circuit, the overvoltage failure representing a failure where the measured output voltage is higher than an upper limit of the predetermined operation guarantee voltage range of the power supply circuit; and
the switch controller is configured to:
select the first switch control task to forcibly shut down the switch upon it being determined that the overvoltage failure has occurred and the measured value of the at least one of the first and second temperature parameters is higher than the predetermined upper limit; and
select the second switch control task to enable the switching operations of the switch to be continuously controlled upon it being determined that the overvoltage failure has occurred and that the measured value of the at least one of the first and second temperature parameters is equal to or lower than the predetermined upper limit.

6. The control circuit according to claim 2, wherein:
the power supply circuit is configured to generate, as the electrical power, an output voltage to the command generator based on an input voltage thereto;
the failure mode determiner is configured to:
measure the input voltage to the power supply circuit;
measure a value of at least one of a first temperature parameter correlating with a temperature of the command generator and a second temperature parameter correlating with a temperature of the power supply circuit; and
determine whether an overvoltage failure as one of the failure modes has occurred in the power supply circuit, the overvoltage failure representing a failure where the measured output voltage is higher than an upper limit of the predetermined operation guarantee voltage range of the power supply circuit; and
the switch controller is configured to selectively execute the first switch control task and the second switch control task in accordance with the measured input voltage and the measured value of the at least one of the first and second temperature parameters upon it being deter mined that the overvoltage failure has occurred.

7. The control circuit according to claim 1, wherein:
the failure mode determiner is configured to:
  determine whether an operation failure has occurred in the command generator; and
the switch controller is configured to select the first switch control task to forcibly shut down the switch upon it being determined that the operation failure has occurred in the command generator.

8. The control circuit according to claim 1, wherein:
the power supply circuit comprises at least upstream and downstream power supply circuits connected to each other, a direct-current power source and the command generator are connected through the upstream and downstream power supply circuits;
the upstream power supply circuit is configured to generate a voltage;
the downstream power supply circuit is configured to step down the generated voltage to thereby generate, as the electrical power, an output voltage directly to the command generator;
the failure mode determiner is configured to execute the determination of whether which of the failure modes has occurred in the downstream power supply circuit.

9. The control circuit according to claim 1, wherein:
the power supply circuit comprises a plurality of power supply circuits; and
the failure mode determiner is configured to execute the determination of whether which of the failure modes has occurred in at least one of the plurality of power supply circuits,
the control circuit further comprising:
  a power supply shutdown unit configured to shut down at least one of the plurality of power supply circuits upon it being determined that at least one of the failures has occurred in the at least one of the plurality of power supply circuits.

10. The control circuit according to claim 9, wherein:
the power supply shutdown unit is configured to shut down all the plurality of power supply circuits upon it being determined that at least one of the failures has occurred in at least one of the plurality of power supply circuits.

11. The control circuit according to claim 1, wherein:
the failure mode determiner comprises:
  a power supply monitor configured to monitor the output voltage of the power supply circuit; and
  a mode determiner configured to:
    execute the determination of whether which of the failure modes has occurred in the power supply circuit in accordance with the monitored output voltage; and
    output a switch shutdown command to the switch controller upon a predetermined condition being satisfied, the predetermined condition being that at least one of the failure modes has occurred in the power supply circuit; and
the switch controller is configured to:
  select the first switch control task to forcibly shut down the switch upon it being determined that the switch shutdown command is input to thereto; and
  select the second switch control task to enable the switching operations of the switch to be continuously controlled upon it being determined that no switch shutdown command is input thereto.

12. The control circuit according to claim 11, wherein:
the mode determiner, the switch controller, and the power supply monitor are constructed as a single integrated circuit.

13. The control circuit according to claim 12, further comprising:
a power supply controller configured to control the power supply circuit,
wherein:
the power supply monitor is configured to determine whether a failure has occurred in the power supply controller; and
the mode determiner is configured to output the switch shutdown command to the switch controller upon a predetermined second condition being satisfied, the predetermined second condition being that the failure has occurred in the power supply controller; and
the mode determiner, the switch controller, the power supply monitor, and the power supply controller are constructed as the single integrated circuit.

* * * * *